(12) United States Patent
Jeon

(10) Patent No.: US 11,464,103 B2
(45) Date of Patent: Oct. 4, 2022

(54) PRINTED CIRCUIT BOARD INCLUDING GROUND LINE FOR CANCELING ELECTROMAGNETIC WAVES GENERATED BY POWER LINE, AND ELECTRONIC DEVICE INCLUDING SAME

(71) Applicant: Samsung Electronics Co., Ltd., Gyeonggi-do (KR)

(72) Inventor: Jaewoong Jeon, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/261,056

(22) PCT Filed: Jul. 22, 2019

(86) PCT No.: PCT/KR2019/009028
§ 371 (c)(1),
(2) Date: Jan. 18, 2021

(87) PCT Pub. No.: WO2020/022722
PCT Pub. Date: Jan. 30, 2020

(65) Prior Publication Data
US 2021/0298165 A1   Sep. 23, 2021

(30) Foreign Application Priority Data
Jul. 26, 2018   (KR) .................. 10-2018-0087060

(51) Int. Cl.
| | | |
|---|---|---|
| *H05K 1/02* | (2006.01) | |
| *H03H 1/00* | (2006.01) | |
| *H05K 1/11* | (2006.01) | |

(52) U.S. Cl.
CPC ......... *H05K 1/0218* (2013.01); *H03H 1/0007* (2013.01); *H05K 1/115* (2013.01)

(58) Field of Classification Search
CPC .. H03H 1/0007; H05K 1/0218; H05K 1/0219; H05K 1/0224; H05K 1/0225; H05K 1/0227; H05K 1/115
(Continued)

(56) References Cited

U.S. PATENT DOCUMENTS 6,198,362 B1 * 3/2001 Harada ................ H05K 1/0231
333/22 R
2008/0023844 A1   1/2008 Choi et al.
(Continued)

FOREIGN PATENT DOCUMENTS

| CN | 101861051 A | 10/2010 |
| JP | 2010-199553 A | 9/2010 |

(Continued)

*Primary Examiner* — Stephen E. Jones
(74) *Attorney, Agent, or Firm* — Cha & Reiter, LLC

(57) ABSTRACT

A printed circuit board according to various embodiments of the present disclosure can include a first substrate layer, a dielectric layer stacked below the first substrate layer, and a second substrate layer stacked below the dielectric layer. The second substrate layer can include: a power line; a ground part disposed to have an isolated area along the power line; and a ground line which extends from the ground part so as to be disposed in the isolated area, and which separates the isolated area into a first area and a second area so as to generate electromagnetic waves for canceling the electromagnetic waves generated by a current flowing through the power line. Other embodiments are also possible.

15 Claims, 16 Drawing Sheets

(58) Field of Classification Search
USPC .......................................................... 333/12
See application file for complete search history.

(56) References Cited

U.S. PATENT DOCUMENTS

| | | |
|---|---|---|
| 2009/0194321 A1 | 8/2009 | Ishimaru et al. |
| 2010/0156523 A1 | 6/2010 | Kwon et al. |
| 2010/0258338 A1 | 10/2010 | Hsu |
| 2011/0247869 A1 | 10/2011 | Koyama |
| 2012/0188025 A1* | 7/2012 | Wu ...................... H05K 1/0227 29/829 |
| 2017/0263567 A1 | 9/2017 | Moon et al. |
| 2017/0303395 A1 | 10/2017 | Ishida et al. |
| 2022/0061151 A1* | 2/2022 | Oh .......................... H05K 1/02 |

FOREIGN PATENT DOCUMENTS

| | | |
|---|---|---|
| KR | 10-0744143 B1 | 7/2007 |
| KR | 10-2010-0073223 A | 7/2010 |
| KR | 10-2017-0048575 A | 5/2017 |
| KR | 10-2017-0105984 A | 9/2017 |
| WO | 2010/150588 A1 | 12/2010 |

* cited by examiner

PRINTED CIRCUIT BOARD INCLUDING GROUND LINE FOR CANCELING ELECTROMAGNETIC WAVES GENERATED BY POWER LINE, AND ELECTRONIC DEVICE INCLUDING SAME

CROSS-REFERENCE TO RELATED APPLICATION(S)

This application is a National Phase Entry of PCT International Application No. PCT/KR2019/009028, which was filed on Jul. 22, 2019, and claims priority to Korean Patent Application No. 10-2018-0087060, which was filed on Jul. 26, 2018, the content of each of which are incorporated herein by reference.

TECHNICAL FIELD

Various embodiments of the disclosure relate to a printed circuit board including a ground line for canceling off the electromagnetic waves generated from the power line between the power line and the ground unit and an electronic device including the same.

BACKGROUND ART

Electronic devices may output stored information as voice or images. As electronic devices are highly integrated, and high-speed, high-volume wireless communication becomes commonplace, an electronic device, such as a mobile communication terminal, is recently being equipped with various functions. For example, an electronic device comes with the integrated functionality, including an entertainment function, such as playing video games, a multimedia function, such as replaying music/videos, a communication and security function for mobile banking, and a scheduling or e-wallet function. Various circuit components are mounted on the printed circuit board of the electronic device to provide the integrated functions and it thus becomes more critical to handle the ground current flowing on the surface of the printed circuit board and to place a power line VBAT.

DETAILED DESCRIPTION OF THE INVENTION

Technical Problem

Various circuit components, such as a communication device, camera, sensor, or audio, are mounted on the printed circuit board of the electronic device, and a power line VBAT is placed in the area where the circuit components are mounted. The ground line adjacent to the circuit components may cause an excessive ground current on the surface of the printed circuit board, and the electromagnetic wave due to the flow of current may be transferred to the surrounding circuit components, causing them to fail to properly function.

In general, to remove or reduce the ground current flowing on the surface of the printed circuit board, there may be utilized a method of island fill processing for partitioning the printed circuit board or fill cut processing on all the layers of the printed circuit board. In the case of the island fill processing or all-layer fill cut processing, the heat radiation performance may be deteriorated by insufficient grounding due to a variation in grounding condition, and the performance of the surrounding antennas may be degraded. As another example, despite all-layer fill cut processing, if the current through the power line VBAT is large, no significant improvement may occur.

According to various embodiments of the disclosure, it is possible to cancel or reduce the electromagnetic waves generated around various circuit components by implementing a double-slit structure having a predetermined shape on the printed circuit board. Thus, it is possible to improve the function of the circuit components.

Technical Solution

According to various embodiments of the disclosure, a printed circuit board may include a first substrate layer, a dielectric layer stacked under the first substrate layer, and a second substrate layer stacked under the dielectric layer. The second substrate layer may include a power line, a ground unit disposed with an area spaced apart along the power line, and a ground line extending from the ground unit and disposed in the spaced area, the ground line separating the spaced area into a first section and a second section to generate an electromagnetic wave cancelling off an electromagnetic wave generated from a current flowing through the power line. Other embodiments are possible.

According to various embodiments of the disclosure, a printed circuit board may include a first conductive layer exposed in a first direction, a second conductive layer disposed in a second direction opposite to the first direction, a third conductive layer disposed in the second direction of the second conductive layer, a fourth conductive layer disposed in the second direction of the third conductive layer, and a fifth conductive layer disposed in the second direction of the fourth conductive layer. The third substrate layer may include a power line, a ground unit disposed with an area spaced apart along the power line, and a ground line extending from the ground unit and disposed in the spaced area, the ground line separating the spaced area into a first section and a second section to generate an electromagnetic wave cancelling off an electromagnetic wave generated from a current flowing through the power line.

According to various embodiments of the disclosure, an electronic device may include a housing, a printed circuit board including a plurality of conductive layers and at least one dielectric layer alternately stacked one over another, an electronic component mounted on the printed circuit board, and a battery disposed adjacent to the printed circuit board. At least one conductive layer of the printed circuit board may include a power line including a first end disposed adjacent to the electronic component, a ground unit disposed with an area spaced apart along the power line, a ground line extending from the ground unit and disposed in the spaced area, the ground line separating the spaced area into a first section and a second section to generate an electromagnetic wave cancelling off an electromagnetic wave generated from a current flowing through the power line, and a double-slit structure formed in the first section and the second section.

Advantageous Effects

According to various embodiments of the disclosure, in the electronic device, a double-slit structure is implemented in the area around the power line VBAT connected with various circuit components disposed on the printed circuit board, thereby reducing the electromagnetic waves generated from the power line.

According to various embodiments of the disclosure, it is possible to implement a double-slit structure positioned in a direction perpendicular or parallel to the power line VBAT connected with various circuit components on the printed circuit board. The double-slit structure may reduce heat radiation and electromagnetic waves transferred to various circuit components, such as a camera, sensor, or communication circuit, thereby supporting efficient operation.

MODE FOR CARRYING OUT THE INVENTION

Figure 1:
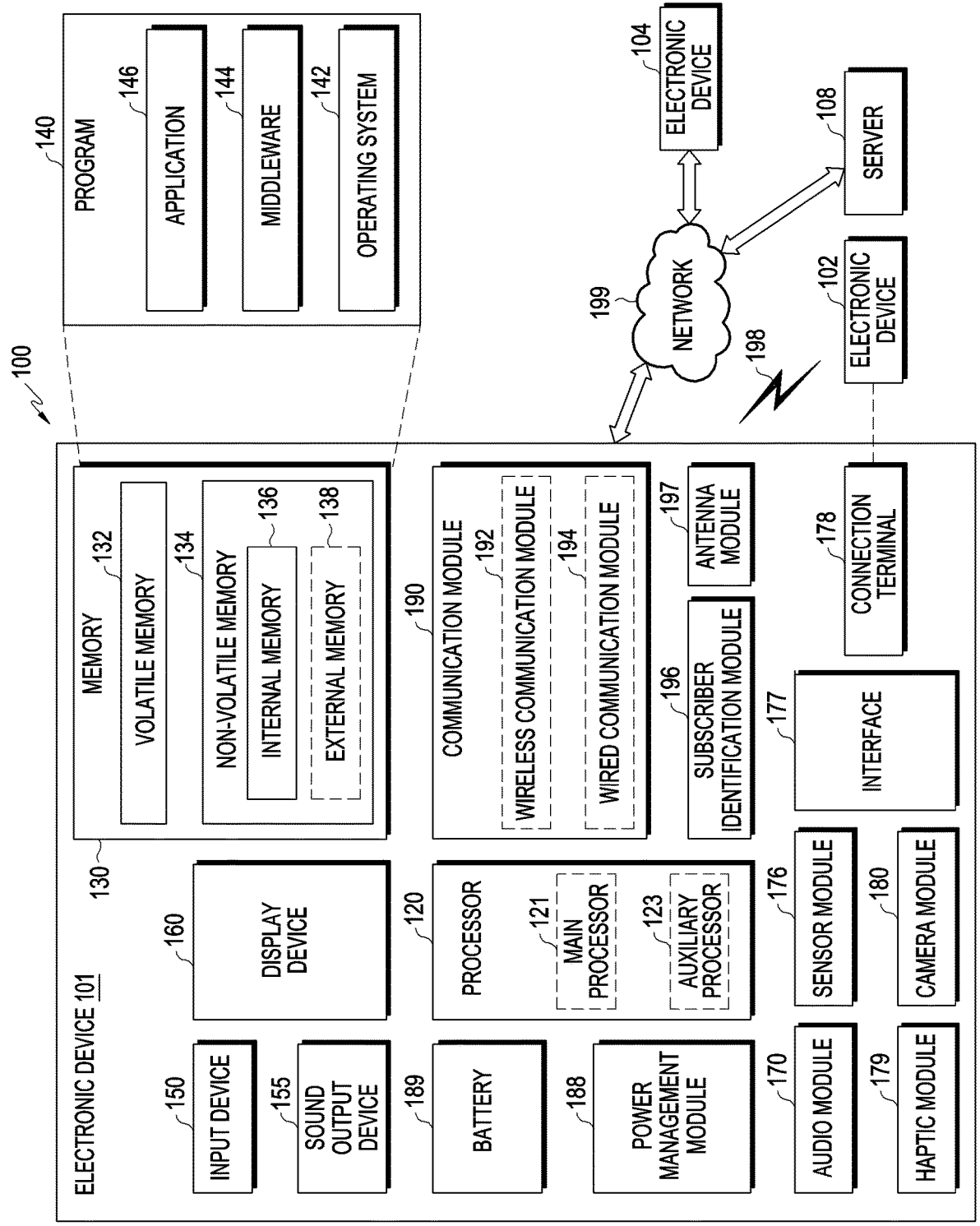
FIG. 1 is a block diagram illustrating an electronic device in a network environment according to various embodiments of the disclosure.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 388 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device). According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, instructions or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™ or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
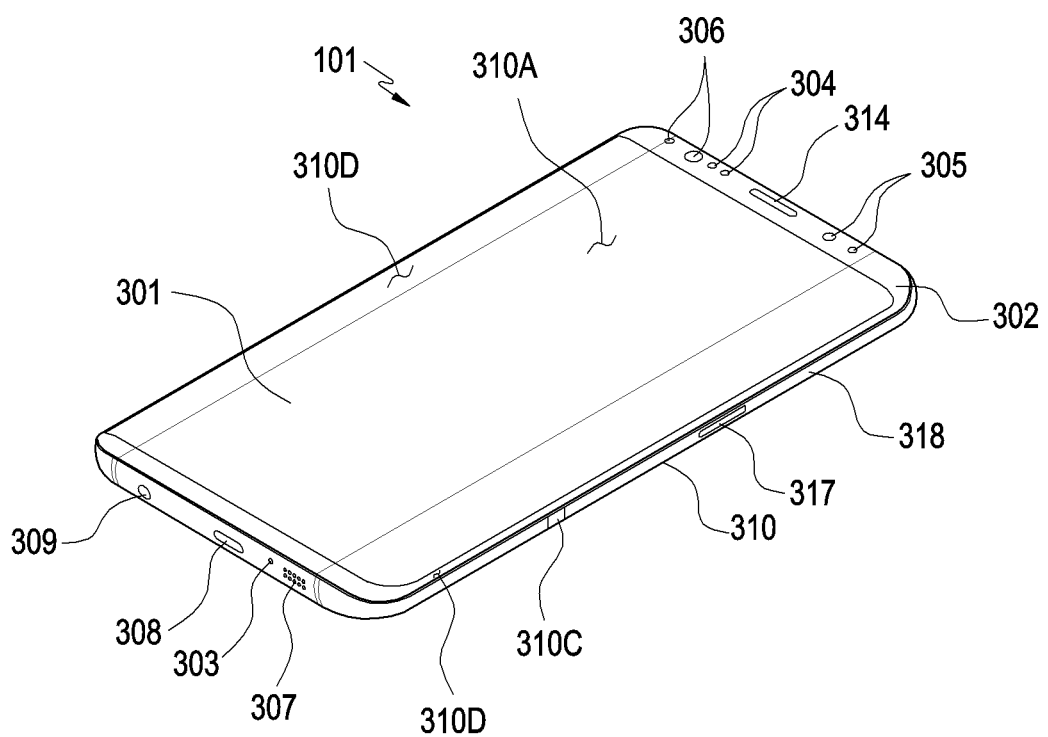
FIG. 2 is a front perspective view illustrating an electronic device according to various embodiments of the disclosure.
Figure 3:
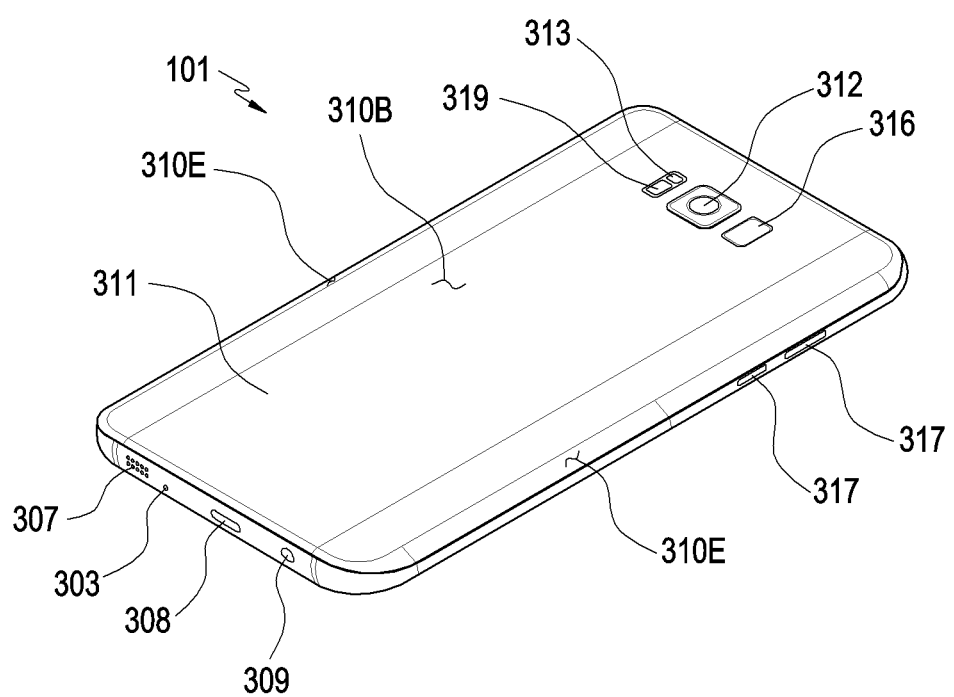
FIG. 3 is a rear perspective view illustrating an electronic device according to various embodiments of the disclosure.

FIG. 2 is a front perspective view illustrating an electronic device 101 according to an embodiment. FIG. 3 is a rear perspective view illustrating an electronic device 101 according to an embodiment.

Referring to FIGS. 2 and 3, according to an embodiment, an electronic device 101 may include a housing 310 with a first (or front) surface 310A, a second (or rear) surface 310B, and a side surface 310C surrounding a space between the first surface 310A and the second surface 310B. According to another embodiment (not shown), the housing may denote a structure forming part of the first surface 310A, the second surface 310B, and the side surface 310C of FIG. 2. According to an embodiment, at least part of the first surface 310A may have a substantially transparent front plate 302 (e.g., a glass plate or polymer plate including various coat layers). The second surface 310B may be formed of a substantially opaque rear plate 311. The rear plate 311 may be formed of, e.g., laminated or colored glass, ceramic, polymer, metal (e.g., aluminum, stainless steel (STS), or magnesium), or a combination of at least two thereof. The side surface 310C may be formed by a side bezel structure (or a "side member") 318 that couples to the front plate 302 and the rear plate 311 and includes a metal and/or polymer. According to an embodiment, the rear plate 311 and the side bezel plate 318 may be integrally formed together and include the same material (e.g., a metal, such as aluminum).

In the embodiment illustrated, the front plate 302 may include two first regions 310D, which seamlessly and bendingly extend from the first surface 310A to the rear plate 311, on both the long edges of the front plate 302. In the embodiment (refer to FIG. 3) illustrated, the rear plate 311 may include two second regions 310E, which seamlessly and bendingly extend from the second surface 310B to the front plate, on both the long edges. According to an embodiment, the front plate 302 (or the rear plate 311) may include only one of the first regions 310 (or the second regions 310E). Alternatively, the first regions 310D or the second regions 301E may partially be excluded. According to an embodiment, at side view of the electronic device 101, the side bezel structure 318 may have a first thickness (or width) for sides that do not have the first regions 310D or the second regions 310E and a second thickness, which is smaller than the first thickness, for sides that have the first regions 310D or the second regions 310E.

According to an embodiment, the electronic device 101 may include at least one or more of a display 301, audio modules 303, 307, and 314, sensor modules 304, 316, and 319, camera modules 305, 312, and 313, key input devices 317, a light emitting device 306, and connector holes 308 and 309. According to an embodiment, the electronic device 101 may exclude at least one (e.g., the key input device 317 or the light emitting device 306) of the components or may add other components.

The display 301 may be exposed through the top of, e.g., the front plate 302. According to an embodiment, at least a portion of the display 301 may be exposed through the front plate 302 forming the first surface 310A and the first regions 310D of the side surface 310C. According to an embodiment, the edge of the display 301 may be formed to be substantially the same in shape as an adjacent outer edge of the front plate 302. According to an embodiment (not shown), the interval between the outer edge of the display 301 and the outer edge of the front plate 302 may remain substantially even to give a larger area of exposure the display 301.

According to an embodiment (not shown), the screen display region of the display 301 may have a recess or opening in a portion thereof, and at least one or more of the audio module 314, sensor module 304, camera module 305, and light emitting device 306 may be aligned with the recess or opening. According to an embodiment (not shown), at least one or more of the audio module 314, sensor module 304, camera module 305, fingerprint sensor 316, and light emitting device 306 may be included on the rear surface of the screen display region of the display 301. According to an embodiment (not shown), the display 301 may be disposed to be coupled with, or adjacent, a touch detecting circuit, a pressure sensor capable of measuring the strength (pressure) of touches, and/or a digitizer for detecting a magnetic field-type stylus pen. According to an embodiment, at least part of the sensor modules 304 and 519 and/or at least part of the key input device 317 may be disposed in the first regions 310D and/or the second regions 310E.

The audio modules 303, 307, and 314 may include a microphone hole 303 and speaker holes 307 and 314. The microphone hole 303 may have a microphone inside to obtain external sounds. According to an embodiment, there may be a plurality of microphones to be able to detect the direction of a sound. The speaker holes 307 and 314 may include an external speaker hole 307 and a phone receiver hole 314. According to an embodiment, the speaker holes 307 and 314 and the microphone hole 303 may be implemented as a single hole, or speakers may be rested without the speaker holes 307 and 314 (e.g., piezo speakers).

The sensor modules 304, 316, and 319 may generate an electrical signal or data value corresponding to an internal operating state or external environmental state of the electronic device 101. The sensor modules 304, 316, and 319 may include a first sensor module 304 (e.g., a proximity sensor) and/or a second sensor module (not shown) (e.g., a fingerprint sensor) disposed on the first surface 310A of the housing 310 and/or a third sensor module 319 (e.g., a heart-rate monitor (HRM) sensor) and/or a fourth sensor module 316 (e.g., a fingerprint sensor) disposed on the second surface 310B of the housing 310. The fingerprint sensor may be disposed on the second surface 310B as well as on the first surface 310A (e.g., the display 301) of the housing 310. The electronic device 101 may further include sensor modules not shown, e.g., at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 304.

The camera modules 305, 312, and 313 may include a first camera device 305 disposed on the first surface 310A of the electronic device 101, and a second camera device 312 and/or a flash 313 disposed on the second surface 310B. The camera modules 305 and 312 may include one or more lenses, an image sensor, and/or an image signal processor. The flash 313 may include, e.g., a light emitting diode (LED) or a xenon lamp. According to an embodiment, two or more lenses (an infrared (IR) camera, a wide-angle lens, and a telescopic lens) and image sensors may be disposed on one surface of the electronic device 101.

The key input device 317 may be disposed on the side surface 310C of the housing 310. According to an embodiment, the electronic device 101 may exclude all or some of the above-mentioned key input devices 317 and the excluded key input devices 317 may be implemented in other forms, e.g., as soft keys, on the display 301. According to an embodiment, the key input device may include the sensor module 316 disposed on the second surface 310B of the housing 310.

The light emitting device 306 may be disposed on, e.g., the first surface 310A of the housing 310. The light emitting device 306 may provide, e.g., information about the state of the electronic device 101 in the form of light. According to an embodiment, the light emitting device 306 may provide a light source that interacts with, e.g., the camera module 305. The light emitting device 306 may include, e.g., an light emitting device (LED), an infrared (IR) LED, or a xenon lamp.

The connector holes 308 and 309 may include a first connector hole 308 for receiving a connector (e.g., a universal serial bus (USB) connector) for transmitting or receiving power and/or data to/from an external electronic device and/or a second connector hole 309 (e.g., an earphone jack) for receiving a connector for transmitting or receiving audio signals to/from the external electronic device.

Figure 4:
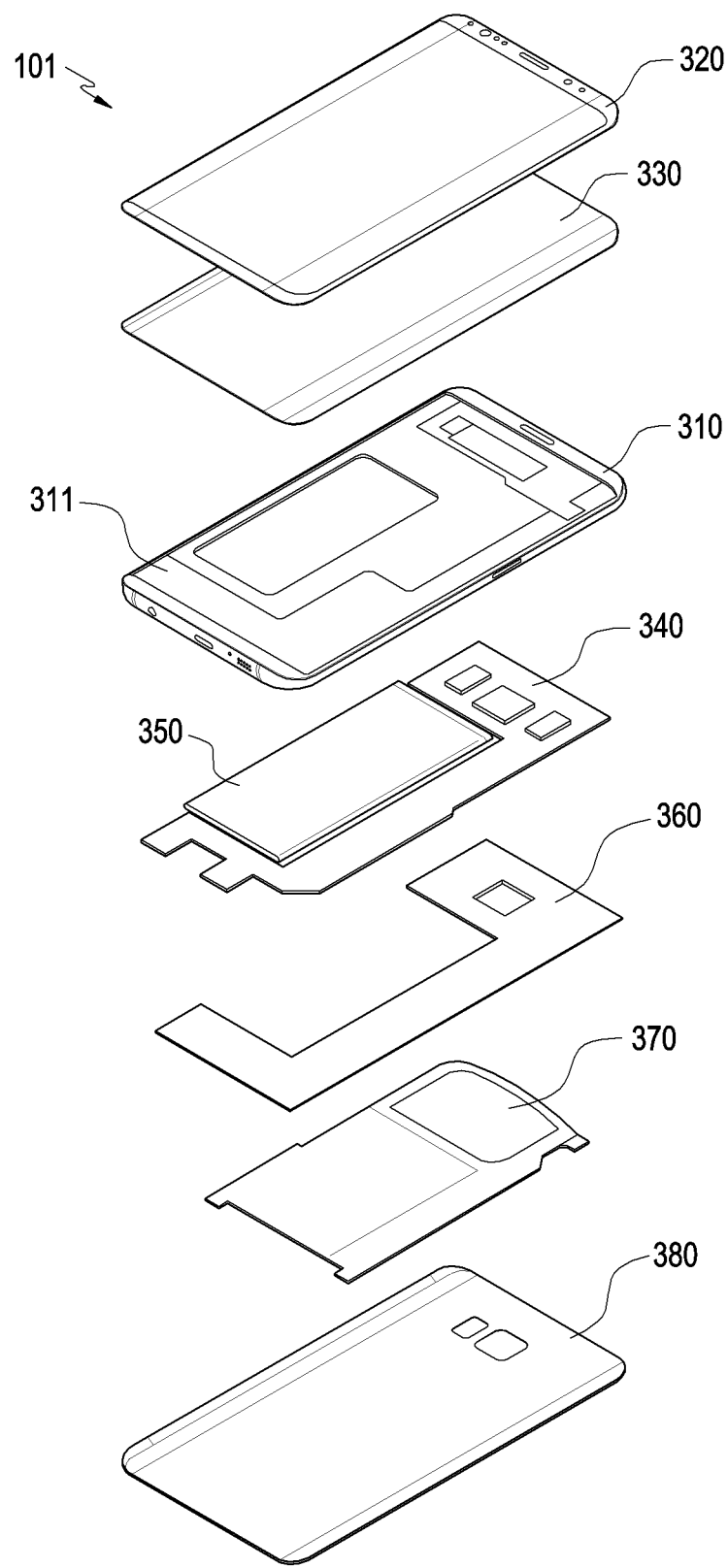
FIG. 4 is an exploded perspective view illustrating an electronic device according to various embodiments of the disclosure.

FIG. 4 is an exploded perspective view illustrating an electronic device 101 according to various embodiments.

Referring to FIG. 4, an electronic device 101 (e.g., the electronic device 101 of FIGS. 1 to 3) may include a side bezel structure 331, a first supporting member 332 (e.g., a bracket), a front plate 320, a display 330, a printed circuit board (PCB) 340, a battery 350, a second supporting member 360 (e.g., a rear case), an antenna 370, and a rear plate 380. According to an embodiment, the electronic device 101 may exclude at least one (e.g., the first supporting member 332 or the second supporting member 360) of the components or may add other components. At least one of the components of the electronic device 101 may be the same or similar to at least one of the components of the electronic device 101 of FIG. 2 or 3 and no duplicate description is made below.

The first supporting member 332 may be disposed inside the electronic device 101 to be connected with the side bezel structure 331 or integrated with the side bezel structure 331. The first supporting member 332 may be formed of, e.g., a metal and/or non-metallic material (e.g., polymer). The display 330 may be joined onto one surface of the first supporting member 332, and the printed circuit board 340 may be joined onto the opposite surface of the first supporting member 311. A processor, memory, and/or interface may be mounted on the printed circuit board 340. The processor may include one or more of, e.g., a central processing unit, an application processor, a graphic processing device, an image signal processing, a sensor hub processor, or a communication processor.

The memory may include, e.g., a volatile or non-volatile memory.

The interface may include, e.g., a high definition multimedia interface (HDMI), a universal serial bus (USB) interface, a secure digital (SD) card interface, and/or an audio interface. The interface may electrically or physically connect, e.g., the electronic device 101 with an external electronic device and may include a USB connector, an SD card/multimedia card (MMC) connector, or an audio connector.

The battery 350 may be a device for supplying power to at least one component of the electronic device 101. The battery 189 may include, e.g., a primary cell which is not rechargeable, a secondary cell which is rechargeable, or a fuel cell. At least a portion of the battery 350 may be disposed on substantially the same plane as the printed circuit board 340. The battery 350 may be integrally or detachably disposed inside the electronic device 101.

The antenna 370 may be disposed between the back plate 380 and the battery 350. The antenna 370 may include, e.g., a near-field communication (NEC) antenna, a wireless charging antenna, and/or a magnetic secure transmission (MST) antenna. The antenna 370 may perform short-range communication with, e.g., an external device or may wirelessly transmit or receive power necessary for charging. According to an embodiment, an antenna structure may be formed by a portion or combination of the side bezel structure 331 and/or the first supporting member 332.

Figure 5:
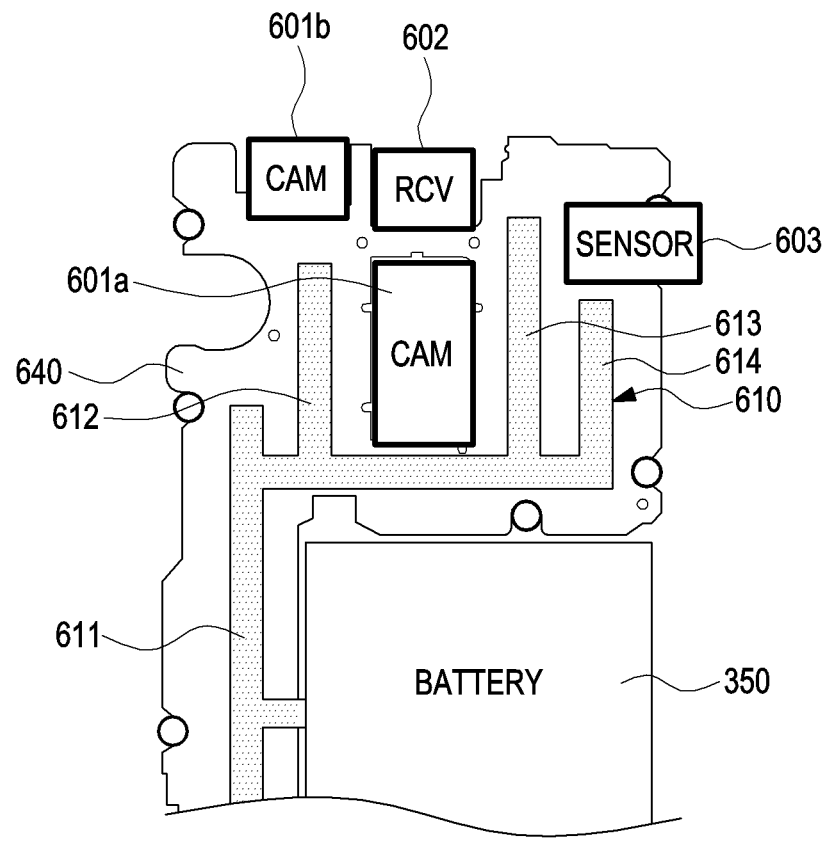
FIG. 5 is a view illustrating various electronic components and a power line around the electronic components mounted on a printed circuit board when viewed from above the top surface of the printed circuit board, according to various embodiments of the disclosure.

FIG. 5 is a view illustrating various electronic components and a power line around the electronic components mounted on a printed circuit board when viewed from above the top surface of the printed circuit board, according to various embodiments of the disclosure.

Referring to FIG. 5, various electronic components may be placed on the printed circuit board 640, and a power line 610 connected from the battery 350 to the various electronic components may be disposed on the printed circuit board 640. The printed circuit board 640 of FIG. 5 may be wholly or partially identical in configuration to the printed circuit board 340 of FIG. 4. The battery 350, camera 601a or 601b, sensor 603, and receiver 602 of FIG. 5 may be wholly or partially identical in configuration to the battery 189, camera module 180, sensor module 176, and audio module 170 of FIG. 1.

According to various embodiments, a first side of the power line 610 may be electrically connected with the battery 350, and a second side of the power line 610 may be electrically connected with various electronic components. The power line 610 may be branched to be disposed adjacent to the area where various electronic components 601a, 601b, 602 or 603 are disposed, and the various electronic components may extend up to the adjacent area. For example, the power line 610 may include a first wiring line 611 branched at a predetermined point to be electrically connected with the battery 350, a second wiring line 612 branched to at least one camera 601a or 601b, and a third wiring line 613 branched to the receiver 602. As another example, a fourth wiring line 614 may be branched to the sensor 603. However, the power line 610 is not limited as branched into four as in the example. The power line 610 may be designed in other various shapes and with four or more wiring lines for electrical connection with various electronic components mounted on the printed circuit board 640.

Figure 6A:
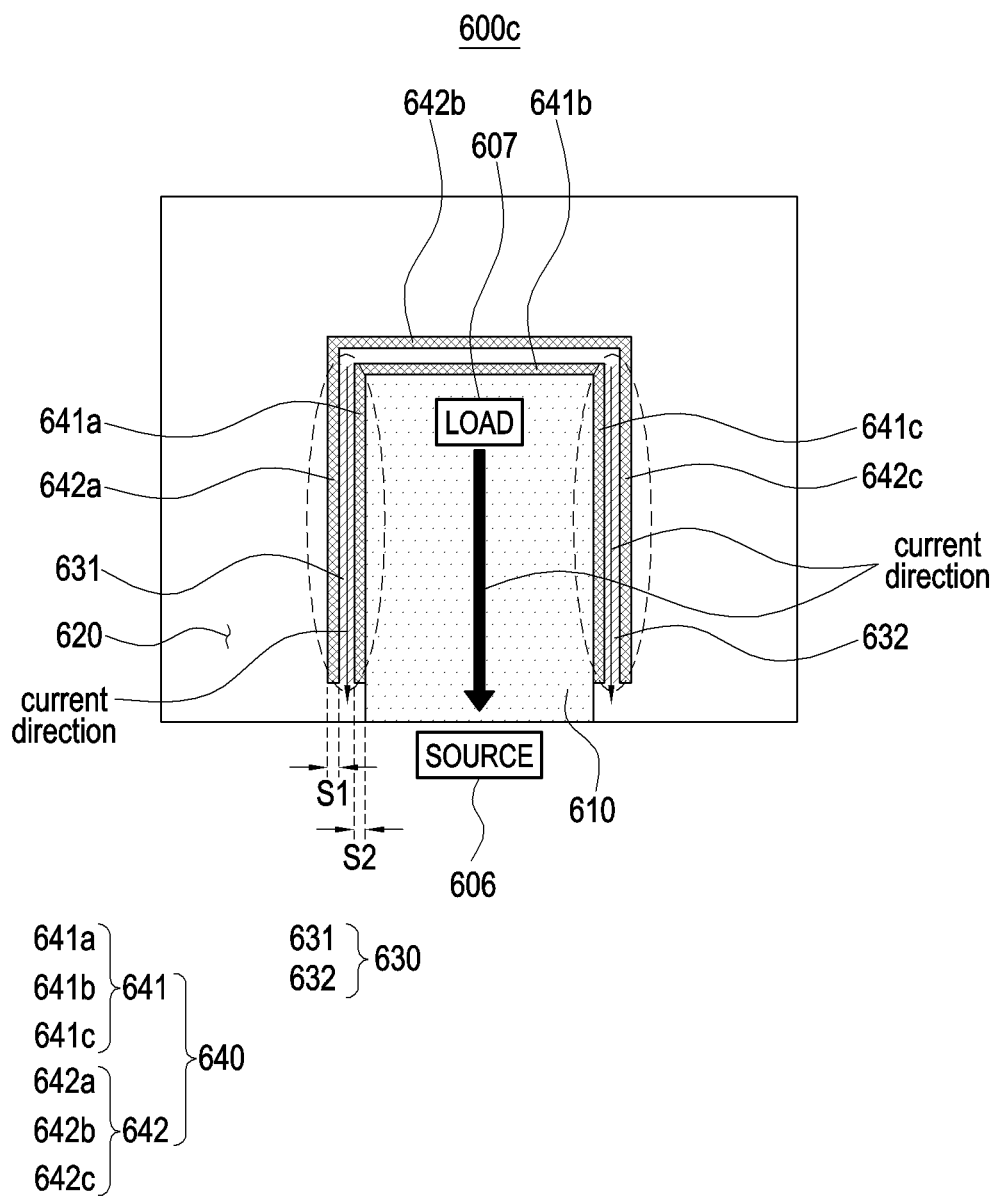
FIG. 6A is a plan view illustrating a structure of a conductive layer of a printed circuit board according to various embodiments of the disclosure.
Figure 6B:
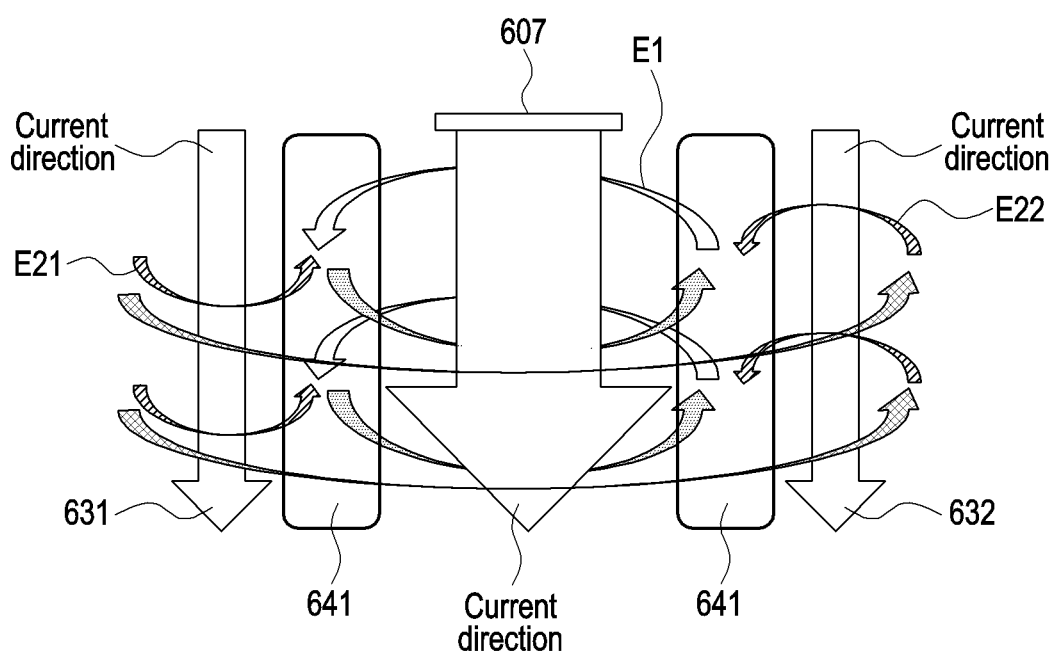
FIG. 6B is a view illustrating an electromagnetic wave generated at a conductive layer of a printed circuit board according to various embodiments of the disclosure.

FIG. 6A is a plan view illustrating a structure of a conductive layer of a printed circuit board according to various embodiments of the disclosure. FIG. 6B is a view illustrating an electromagnetic wave generated at a conductive layer of a printed circuit board according to various embodiments of the disclosure.

Figure 7:
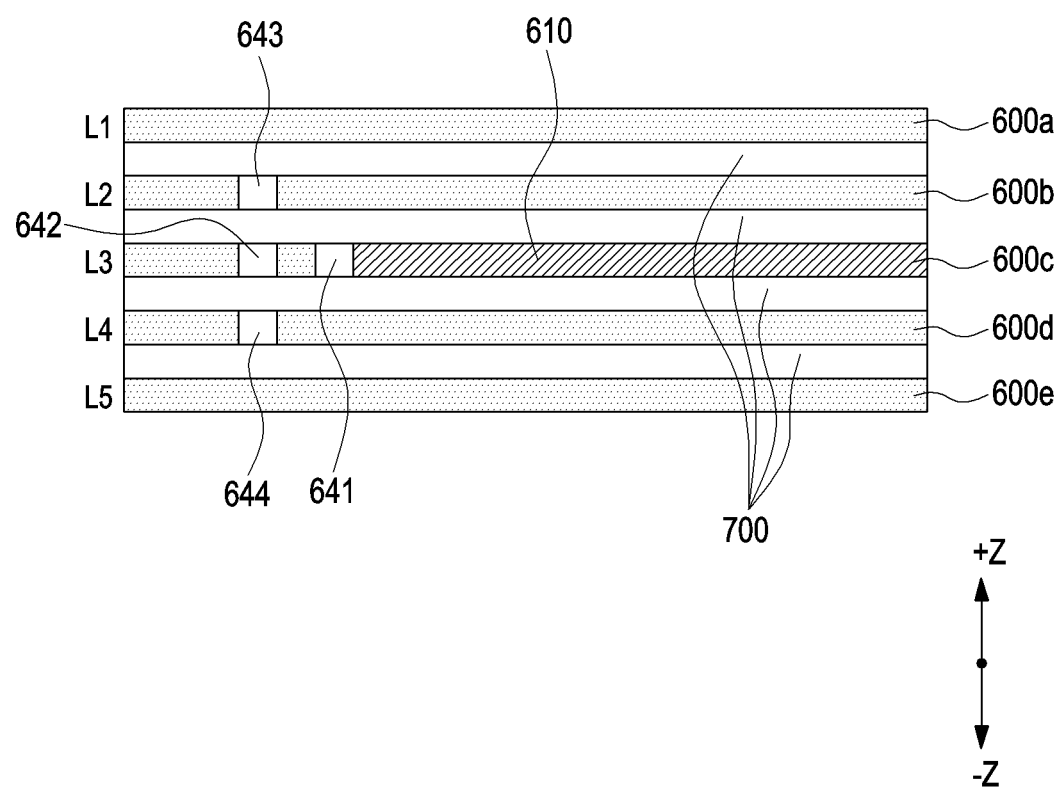
FIG. 7 is a cross-sectional view illustrating a stacked structure of a printed circuit board according to various embodiments of the disclosure.

According to various embodiments, a printed circuit board (e.g., the printed circuit board 340 of FIG. 4) disposed in an electronic device (e.g., the electronic device 101 of FIGS. 1 to 4) may include a first substrate layer (e.g., the first layer 600a or second layer 600b of FIG. 7), a dielectric layer (e.g., the dielectric layer 700 of FIG. 7), and a second substrate layer 600c (e.g., the third layer 600c of FIG. 7). The first substrate layer 600a or 600b, the dielectric layer 700, and the second substrate layer 600c may be stacked. The dielectric layer 700 may be provided between the first substrate layer 600a or 600b and the second substrate layer 600c to prevent the first substrate layer 600a or 600b and the second substrate layer 600c, which are formed of the conductive layers, from directly contacting each other.

Referring to FIGS. 6A and 6B, the second substrate layer 600c may include a power line 610, a ground unit 620, a ground line 630, and a slit 640.

According to various embodiments, the power line VBAT 610 may be electrically connected with a power source (e.g., the battery of FIG. 5) (source) 606 and extend to a portion of the second substrate layer 600c. The end of the power line 610, which extends to the portion of the second substrate layer 600c, may be connected to each load (e.g., electronic component) 607 mounted on the printed circuit board.

Corresponding to the current flowing to the power line 610, an electromagnetic wave may be generated around the power line. For example, a relatively stronger electromagnetic wave may be generated from the area of the load 607, which corresponds to the end of the power line 610 than from the other areas.

According to various embodiments, the ground unit 620 may be spaced apart along the power line 610. For example, the spaced area may be an area formed to surround at least part of the power line 610, and at least one slit 640 and the ground line 630 may be formed in the area.

According to various embodiments, the ground line 630 may extend from the ground unit 620, be disposed in the spaced area, and generate a parasitic electromagnetic wave that cancels off the electromagnetic wave generated from the current flowing through the power line 610. The ground line 630 may be disposed to divide the spaced area into a first section S1 and a second section S2. For example, the ground line 630 may be disposed along the middle of the spaced area to partition the spaced area.

According to an embodiment, the ground line 630 may be disposed in parallel with, and spaced apart from, the power line 610. For example, the ground line 630 may include a first ground line 631 and a second ground line 632, as prepared in plurality. The first ground line 631 and the second ground line 632 may be spaced apart from each other, with the power line 610 disposed therebetween. The first ground line 631 and the second ground line 632 may be prepared in the sizes and shapes corresponding to each other and may generate a parasitic current that faces in the direction parallel with the direction of the current flowing through the power line 610 corresponding to when the power line 610 generates the current from the power source 606 to the load 607.

According to an embodiment, a slit 640 may be formed around the area where the ground line 630 is disposed. For example, when the ground line 630 is formed along the lengthwise direction in the central portion of the spaced area to separate the spaced area into the first section S1 and the second section S2, a first slit 641 shaped as an opening penetrating the second substrate layer 600*c* may be formed in the first section S1 provided on one side of the ground line 630. As another example, the first slit 641 shaped as an opening penetrating the second substrate layer 600*c* may be formed in the second section S2 provided on the other side of the ground line 630.

According to an embodiment, the slit 640 may be prepared in a double-slit structure separated into two. The first slit 641 may be formed to surround a terminal area of the power line 610. The power line 610 connected to the side of the load 607 may be shaped as an end of a line, and the first slit 641 may be formed along the edge of the end of the line. The first slit 641 may include a first-first line 641*a*, a first-second line 641*b* extending from the first-first line 641*a* and facing in a direction different from the first-first line 641*a*, and a first-third line 641*c* extending from the first-second line 641*b* and facing in the same direction as the first-first line 641*a*. For example, the first slit 641 may be shaped as '⊓'.

According to an embodiment, the first-first line 641*a* of the first slit 641 may be at least partially prepared in a length or size corresponding to the first ground line 631 so that the power line 610 and the first ground line 631 are spaced apart from each other. As another example, the first-third line 641*c* of the first slit 641 may be at least partially prepared in a length or size corresponding to the second ground line 632 so that the power line 610 and the second ground line 632 are spaced apart from each other.

According to an embodiment, when a current is generated form the power line 610, the structure of the first slit 641 may provide an area where a parasitic current flows to the first ground line 631 and the second ground line 632 in the same direction as the current generated from the power line 610. For example, when a current is generated in the power line 610 in the direction form the load 607 to the power source 606, a parasitic current may accordingly be generated at the ground line 630 in a direction parallel with the direction in which the current flows through the power line 610. The electromagnetic wave (e.g., the magnetic field E1 of FIG. 6B) generated around the power line 610 may be canceled off by the electromagnetic wave (e.g., the magnetic field E21 or E22 of FIG. 6B) generated by the parasitic current, preventing influence on the surroundings of the power line 610. For example, the first ground line 631 may be disposed on the left side of the power line 610, with the first-first line 641*a* disposed therebetween, and the second ground line 632 may be disposed on the right side of the power line 610, with the first-third line 641*c* disposed therebetween. Accordingly, the electromagnetic wave (e.g., the magnetic field E21 of FIG. 6B) generated from the first ground line 631 may cancel off a predetermined amount of the electromagnetic wave generated on the left side of the power line 610, in the first-first line 641*a* area of the first slit 641, and the electromagnetic wave (e.g., the magnetic field E22 of FIG. 6B) generated from the second ground line 632 may cancel off a predetermined amount of the electromagnetic wave generated on the right side of the power line 610 in the first-third line 641*c* area of the first slit 641.

According to an embodiment, the second slit 642 may be formed to surround the terminal area in the form of being partially spaced apart from the terminal area of the power line 610. The second slit 642 may be formed, in a shape corresponding to the first slit 641, to be spaced apart from the first slit 641, and the power line 610 may be disposed in at least a partial area between the first slit 641 and the second slit 642.

According to an embodiment, the second slit 642 may include a second-first line 642, a second-second line 642*b* extending from the second-first line 642*a* and facing in a direction different from the second-first line 642*a*, and a second-third line 642*c* extending from the second-second line 642*b* and facing in the same direction as the second-first line 642*a*. For example, the second slit 642 may be shaped as '⊓'. However, the second slit 642 is not limited as including all of the second-first line 642*a*, the second-second line 642*b*, and the second-third line 642*c*, but depending on the arrangement of the circuit configuration, some lines may be omitted. For example, when the circuit configuration is disposed only in a one-side area of the power line 610, the line of the second slit 642 may be formed only in the one-side area where the circuit configuration is formed so as to reduce influence by the power line 610 in a specific direction associated with the circuit configuration.

According to an embodiment, the second-first line 642*a* of the second slit 642 may be at least partially prepared in a length or size corresponding to the first ground line 631 so that at least a partial area of the first ground line 631 and the ground unit 620 are spaced apart from each other. As another example, the second-third line 642*c* of the second slit 642 may be at least partially prepared in a length or size corresponding to the second ground line 632 so that at least a partial area of the second ground line 632 and the ground unit 620 are spaced apart from each other.

According to an embodiment, when a current is generated form the power line 610, the structure of the second slit 642 may provide an area where a parasitic current flows to the first ground line 631 and the second ground line 632 in the same direction as the current generated from the power line 610. For example, when a current is generated in the power line 610 in the direction form the load 607 to the power source 606, a parasitic current may accordingly be generated at the ground line 630 in a direction parallel with the direction in which the current flows through the power line 610. The electromagnetic wave generated around the power line 610 may be attenuated by the electromagnetic wave generated by the parasitic current, preventing influence on the surroundings of the power line 610. For example, the first ground line 631 may be disposed on the left side of the power line 610 between the first-first line 641a and the second-first line 642a, and the second ground line 632 may be disposed on the right side of the power line 610 between the first-third line 641c and the second-third line 642c. Accordingly, the electromagnetic wave generated from the first ground line 631 may attenuate the electromagnetic wave generated on the left side of the power line 610, in the second-first line 642a area of the second slit 642, and the electromagnetic wave generated from the second ground line 632 may attenuate the electromagnetic wave generated on the right side of the power line 610 in the second-third line 642c area of the second slit 642.

Figure 8:
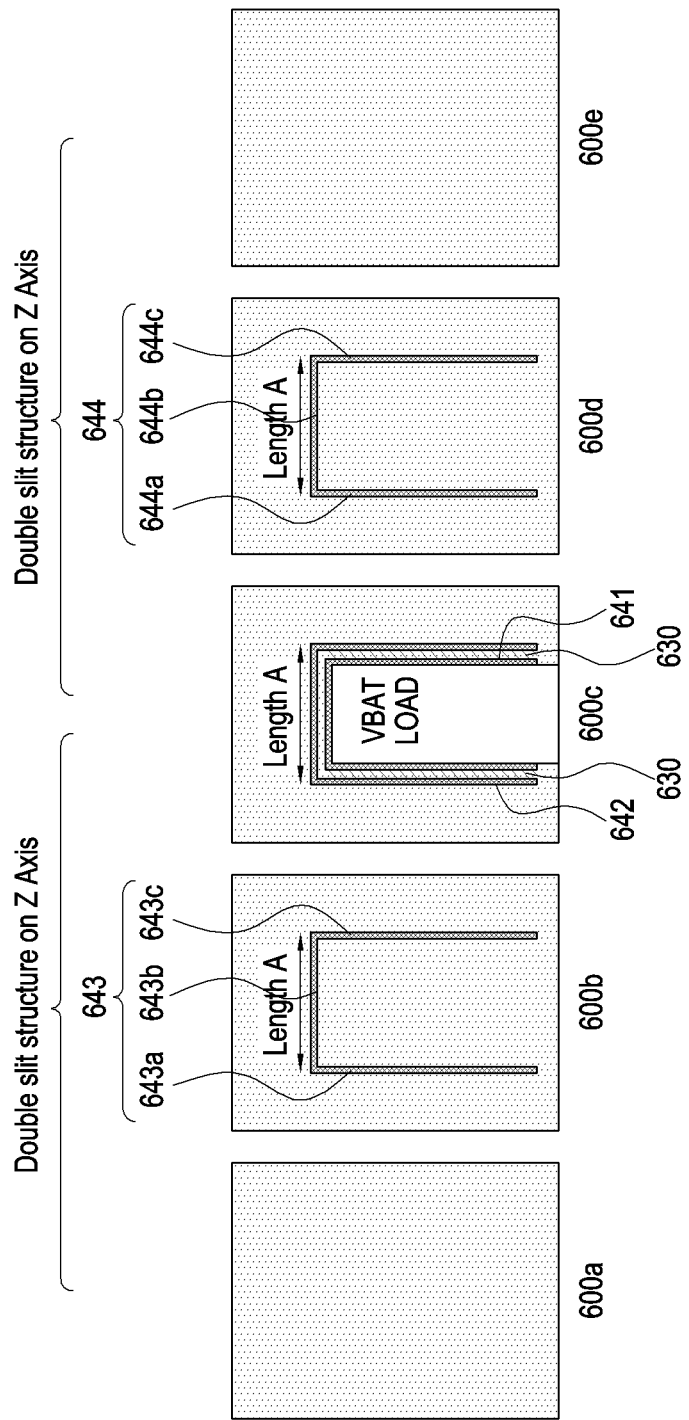
FIG. 8 is a view illustrating an arrangement of a plurality of substrates forming a printed circuit board according to various embodiments of the disclosure.

FIG. 7 is a cross-sectional view illustrating a stacked structure of a printed circuit board according to various embodiments of the disclosure. FIG. 8 is a view illustrating an arrangement of a plurality of substrates forming a printed circuit board according to various embodiments of the disclosure.

Referring to FIGS. 7 and 8, the printed circuit board 640 may include a plurality of conductive layers 600a, 600b, 600c, 600d, and 600e and at least one dielectric layer 700. The printed circuit board 640 of FIGS. 7 and 8 may be wholly or partially identical in structure to the printed circuit board 640 of FIGS. 4 and 5. The first layer 600a and/or the second layer 600b of the printed circuit board 640 of FIGS. 7 and 8 may be the first substrate layer of FIG. 6A, and the third layer 600c of the printed circuit board 640 of FIGS. 7 and 8 may be the second substrate layer 600c of FIG. 6A.

According to various embodiments, the printed circuit board 640 may be a main printed circuit board (e.g., the printed circuit board 340 of FIG. 4) of the electronic device (e.g., the electronic device 101 of FIGS. 1 to 4) and may have various electronic components mounted thereon. The printed circuit board 640 may be disposed to have a structure in which a plurality of conductive layers 600a, 600b, 600c, 600d, and 600e and at least one dielectric layer 700 are alternately stacked one over another.

According to various embodiments, the plurality of conductive layers 600a, 600b, 600c, 600d, and 600e may be arranged along the stacked direction between the dielectric layers 700, alternately with the dielectric layers 700. The plurality of conductive layers 600a, 600b, 600c, 600d, and 600e may have at least one conductive via to electrically connect them. For example, the printed circuit board 640 may include a first layer 600a exposed in a first direction (e.g., the forward direction) (+Z), a second layer 600b disposed in a second direction (e.g., the backward direction) (−Z) of the first layer 600a, a third layer 600c disposed in the second direction −Z of the second layer 600b, a fourth layer 600d disposed in the second direction −Z of the third layer 600c, and a fifth layer 600e disposed in the second direction −Z of the fourth layer 600d. The first layer 600a, the second layer 600b, the third layer 600c, the fourth layer 600d, and the fifth layer 600e may be conductive layers.

The dielectric layer 700 is provided between the conductive layers 600a, 600b, 600c, 600d, and 600e to prevent the conductive layers 302 from contacting, and resultantly electrically connecting to, each other. For example, the dielectric layer 700 may be disposed between the first layer 600a and the second layer 600b, between the second layer 600b and the third layer 600c, between the third layer 600c and the fourth layer 600d, and between the fourth layer 600d and the fifth layer 600e. However, the printed circuit board 640 is not limited as including five substrate layers and four dielectric layers arranged alternately with one another as shown in FIGS. 6 and 7 but may rather be designed to have more or less substrate layers and dielectric layers arranged than those shown.

According to various embodiments, the third layer 600c may include a power line 610, a ground unit 620, a ground line 630, and a slit 640.

According to an embodiment, the power line 610 (VBAT) may electrically connect from the power source and extend to a partial area of the second substrate layer 600c.

According to an embodiment, the ground unit 620 may be spaced apart along the power line 610. The spaced area may be an area formed to surround at least part of the power line 610, and a double-slit structure may be formed in the area.

According to an embodiment, the double-slit structure may include a first slit 641 formed along the edge of a terminal area of the power line 610 and a second slit 642 having a shape corresponding to the first slit 641 and spaced apart from the first slit 641. The second slit 642 may have an opening area larger than the opening area of the first slit 641. The first slit 641 may include a first-first line 641a, a first-second line 641b extending from the first-first line 641a and facing in a direction different from the first-first line 641a, and a first-third line 641c extending from the first-second line 641b and facing in the same direction as the first-first line 641a. The second slit 642 may include a second-first line 642, a second-second line 642b extending from the second-first line 642a and facing in a direction different from the second-first line 642a, and a second-third line 642c extending from the second-second line 642b and facing in the same direction as the second-first line 642a. The second-second line 642b may be formed in a predetermined length A.

According to an embodiment, the ground line 630 may be disposed in parallel with, and spaced apart from, the power line 610. For example, the ground line 630 may include a first ground line 631 and a second ground line 632, as prepared in plurality. The first ground line 631 may be disposed between the first-first slit 640 and the second-first slit 640 so that a parasitic current may be generated in the same direction as the current generated from the power line 610. As another example, the second ground line 632 may be disposed between the first-third slit 640 and the second-third slit 640 so that a parasitic current may be generated in the same direction as the current generated from the power line 610.

According to various embodiments, the first layer 600a may form an upper surface of the printed circuit board 640 and be formed of a conductive layer to form a ground area of the printed circuit board 640. According to various embodiments, the second layer 600b may be disposed to face the first layer 600a in a size corresponding to the first layer 600a and may include at least one third slit 643. The third slit 643 may be shaped as an opening penetrating the second layer 600b and may be prepared in a size corresponding to the second slit 642 of the third layer, with the dielectric layer 700 disposed therebetween. For example, the third slit 643 may include a third-first line 643a, a third-second line 643b extending from the third-first line 643a and facing in a direction different from the third-first line 643a, and a third-third line 643c extending from the third-second line 643b and facing in the same direction as the third-first line 643a. For example, the third slit 643 may be shaped as '⊓'. As another example, the third-second line 643b of the third slit 643 may be formed to have a predetermined length A to correspond to the second-second line 642b of the second slit 642. However, the third slit 643 is not limited to such a shape, but its overall shape may correspond to the shape of the second slit 642 and may partially be changed depending on the arrangement of the electronic components and/or lines mounted on the second layer 600b. According to various embodiments, the third slit 643 formed in the second layer 600b, along with the second slit 642 formed in the third layer 600c, may form a double-slit structure along the stacked direction of the printed circuit board 640. The double-slit structure may reduce the electromagnetic waves generated as current flows through the power line 610.

According to an embodiment, although not shown, a plurality of third slits 643 may be formed in the second layer 600b. For example, there may be provided a third slit 643 corresponding to the second slit 642 and another third slit corresponding to the first slit 641. Thus, the third slits 643 may implement a double-slit structure that is positioned in the horizontal direction in the second layer 600b.

According to various embodiments, the fourth layer 600d may be disposed to face the third layer 600c in a size corresponding to the third layer 600c and may include at least one fourth slit 644. The fourth slit 644 may be shaped as an opening penetrating the fourth layer 600d and may be prepared in a size corresponding to the second slit 642 of the third layer 600c, with the dielectric layer 700 disposed therebetween. For example, the fourth slit 644 may include a fourth-first line 644a, a fourth-second line 644b extending from the fourth-first line 644a and facing in a direction different from the fourth-first line 644a, and a fourth-third line 644c extending from the fourth-second line 644b and facing in the same direction as the fourth-first line 644a. For example, the fourth slit 644 may be shaped as '⊓'. As another example, the fourth-second line 644b of the fourth slit 644 may be formed to have a predetermined length A to correspond to the second-second line 642b of the second slit 642. However, the fourth slit 644 is not limited to such a shape, and its overall shape may correspond to the shape of the second slit 642 and may partially be varied in design depending on the arrangement of the electronic components and/or lines mounted on the fourth layer 600d.

According to various embodiments, the fourth slit 644 formed in the fourth layer 600d, along with the second slit 642 formed in the third layer 600c, may form a double-slit structure along the stacked direction of the printed circuit board 640. The double-slit structure may reduce the electromagnetic waves generated as current flows through the power line 610.

According to an embodiment, although not shown, a plurality of fourth slits 644 may be formed in the fourth layer 600d. For example, there may be provided a fourth slit 644 corresponding to the second slit 642 and another fourth slit corresponding to the first slit 641. Thus, the fourth slits 644 may implement a double-slit structure that is positioned in the horizontal direction in the fourth layer 600d.

According to various embodiments, the fifth layer 600e may form a lower surface of the printed circuit board 640 and be formed of a conductive layer to form a ground area of the printed circuit board 640.

Figure 9:
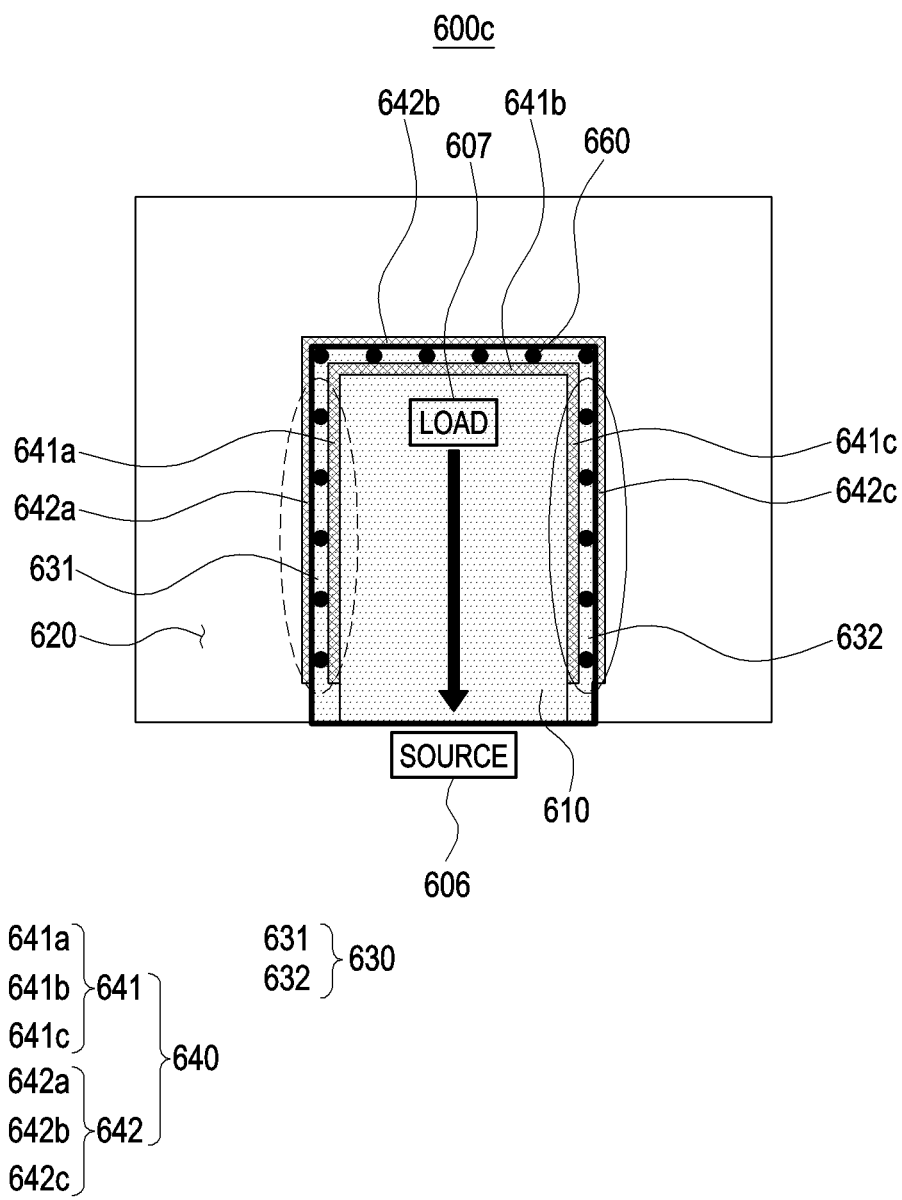
FIG. 9 is a plan view illustrating a structure of a conductive layer of a printed circuit board according to another embodiment of the disclosure.

FIG. 9 is a plan view illustrating a structure of a conductive layer of a printed circuit board according to another embodiment of the disclosure.

According to various embodiments, a printed circuit board (e.g., the printed circuit board 340 of FIG. 4) disposed in an electronic device (e.g., the electronic device 101 of FIGS. 1 to 4) may include a first substrate layer (e.g., the first layer 600a or second layer 600b of FIG. 7), a dielectric layer (e.g., the dielectric layer 700 of FIG. 7), and a second substrate layer 600c. The first substrate layer 600a or 600b, the dielectric layer 700, and the second substrate layer 600c may be stacked. The dielectric layer 700 may be provided between the first substrate layer 600a or 600b and the second substrate layer 600c to prevent the first substrate layer 600a or 600b and the second substrate layer 600c, which are formed of the conductive layers, from directly contacting each other.

Referring to FIG. 9, the second substrate layer 600c may include a power line 610, a ground unit 620, a ground line 630, a slit 640, and a plurality of conductive vias 660. The structure of the power line 610, ground unit 620, ground line 630, and slit 640 of the second substrate layer 600c of FIG. 6A may be applied to the structure of the power line 610, ground unit 620, ground line 630, and slit 640 of the second substrate layer 600c of FIG. 9. The configuration of the printed circuit board 640 of FIG. 9 is described below, focusing on what is different in configuration from the printed circuit board 640 of FIG. 6A.

According to various embodiments, the power line VBAT 610 may be electrically connected with a power source (e.g., the battery of FIG. 5) (source) 606 and extend to a portion of the second substrate layer 600c. The end of the power line 610, which extends to the portion of the second substrate layer 600c, may be connected to each load (e.g., electronic component) 607 mounted on the printed circuit board.

According to various embodiments, the ground unit 620 may be spaced apart along the power line 610.

According to various embodiments, the ground line 630 may extend from the ground unit 620 and be disposed in the spaced area. According to an embodiment, the ground line 630 may be formed to be spaced apart from the power line 610 by the slit 640, and a parasitic current generated by the ground line 630, corresponding to the current flowing through the power line 610, may generate an electromagnetic wave canceling off the electromagnetic wave formed from the power line 610.

According to various embodiments, a double-slit structure 640 may be formed around the area where the ground line 630 is disposed. For example, a first slit 641 may be formed in an area (e.g., the first section) adjacent to the power line 610, with the ground line 630 disposed therebetween, and a second slit 642 may be formed in an area (e.g., the second section) adjacent to the ground unit 620. According to an embodiment, the first slit 641 may be formed to surround a terminal area of the power line 610. The first slit 641 may include a first-first line 641a, a first-second line 641b extending from the first-first line 641a and facing in a direction different from the first-first line 641a, and a first-third line 641c extending from the first-second line 641b and facing in the same direction as the first-first line 641a. The second slit 642 may be prepared in a shape corresponding to the first slit

641. The second slit 642 may include a second-first line 642, a second-second line 642b extending from the second-first line 642a and facing in a direction different from the second-first line 642a, and a second-third line 642c extending from the second-second line 642b and facing in the same direction as the second-first line 642a.

According to various embodiments, a plurality of conductive vias 660 may be formed between the first slit 641 and the second slit 642. For example, the plurality of conductive vias 660 may be arranged in a predetermined array between the first slit 641 and the second slit 642 and be formed to penetrate the second substrate layer 600c.

According to an embodiment, the plurality of conductive vias 660 may be arranged in a row between the first-first line 641a and the second-first line 642a and be formed in the area where the first ground line 631 is disposed. As another example, the conductive vias 660 may be arranged in a row between the first-third line 641c and the second-third line 642c and be formed in the area where the first ground line 631 is disposed. As another example, the conductive vias 660 may be arranged in a row between the first-second line 641b and the second-second line 642b.

According to an embodiment, at least some of the conductive vias 660 may be formed to be electrically connected with the first substrate layer 600a or 600b to collectively conduct through all the layers (e.g., the first substrate layer 600a or 600b and the second substrate layer 600c). As another example, when other multiple substrates (e.g., conductive layers) than the first substrate layer 600a or 600b are additionally stacked in the printed circuit board 640, the conductive vias 660 may be formed only in the substrate layer above or under the second substrate layer 600c to selectively conduct only between substrate layers.

When a current is generated form the power line 610, the structure of the first slit 641 and the second slit 642 may provide an area where a parasitic current flows to the first ground line 631 and the second ground line 632 in the same direction as the current generated from the power line 610. The electromagnetic wave generated around the power line 610 as the current flows may be canceled or attenuated by the electromagnetic wave generated by the parasitic current, preventing influence on the surroundings of the power line 610.

Figure 10:
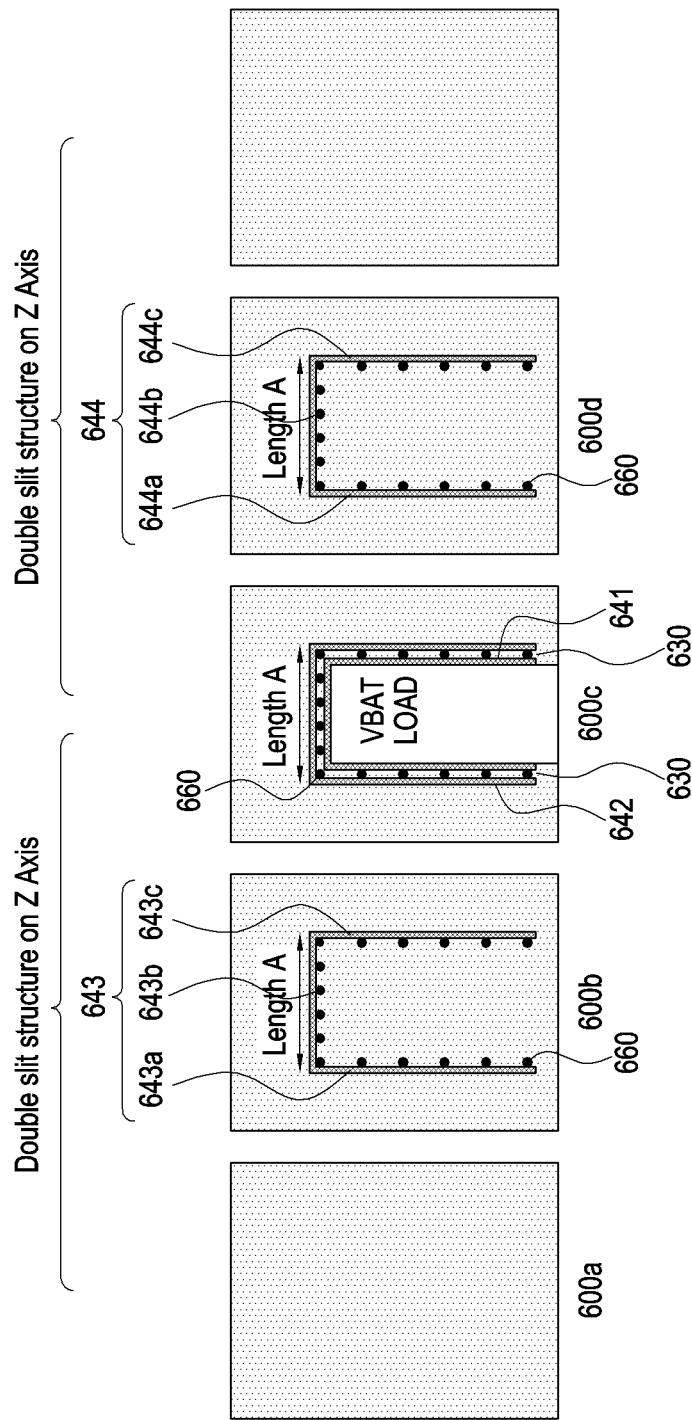
FIG. 10 is a view illustrating an arrangement of a plurality of substrates forming a printed circuit board according to still another embodiment of the disclosure.

FIG. 10 is a view illustrating an arrangement of a plurality of substrates forming a printed circuit board according to still another embodiment of the disclosure.

According to various embodiments, the printed circuit board 640 may be a main printed circuit board of the electronic device (e.g., the electronic device 101 of FIGS. 1 to 4) and may have various electronic components mounted thereon. The structure of the printed circuit board 640 of FIGS. 7 and 8 may be applied to the structure of the printed circuit board 640 of FIG. 10. The following description focuses primarily on the differences.

According to various embodiments, the printed circuit board 640 may include the plurality of conductive layers stacked one over another along the stacked direction, between the dielectric layers, and alternately with the dielectric layers. The plurality of conductive layers 600a, 600b, 600c, 600d, and 600e may have at least one conductive via 660 to electrically connect them.

According to an embodiment, the printed circuit board 640 may include a first layer 600a exposed in a forward direction, a second layer 600b stacked in a backward direction of the first layer 600a, a third layer 600c stacked in a backward direction of the second layer 600b, a fourth layer 600d stacked in a backward direction of the third layer 600c, and a fifth layer 600e stacked in a backward direction of the fourth layer 600d. The first layer 600a, the second layer 600b, the third layer 600c, the fourth layer 600d, and the fifth layer 600e may be conductive layers. The dielectric layer is provided between the conductive layers to prevent the conductive layers from contacting and electrically connecting to each other. For example, the dielectric layer 700 may be disposed between the first layer 600a and the second layer 600b, between the second layer 600b and the third layer 600c, between the third layer 600c and the fourth layer 600d, and between the fourth layer 600d and the fifth layer 600e.

According to various embodiments, the third layer 600c may include a power line 610, a ground unit 620, a ground line 630, a slit 640, and conductive vias 660.

According to an embodiment, the power line 610 (VBAT) may electrically connect from the power source and extend to a partial area of the second substrate layer 600c. According to an embodiment, the ground unit 620 may be spaced apart along the power line 610. The spaced area may be an area formed to surround at least part of the power line 610, and a double-slit structure may be formed in the area.

According to an embodiment, the double-slit structure 640 may include a first slit 641 formed along the edge of a terminal area of the power line 610 and a second slit 642 having a shape corresponding to the first slit 641 and spaced apart from the first slit 641.

According to an embodiment, the ground line 630 may be disposed in parallel with, and spaced apart from, the power line 610. For example, the ground line 630 may include a first ground line 631 and a second ground line 632, as prepared in plurality. The first ground line 631 may be disposed between the first-first slit 640 and the second-first slit 640 so that a parasitic current may be generated in the same direction as the current generated from the power line 610. As another example, the second ground line 632 may be disposed between the first-third slit 640 and the second-third slit 640 so that a parasitic current may be generated in the same direction as the current generated from the power line 610.

According to various embodiments, a plurality of conductive vias 660 may be formed between the first slit 641 and the second slit 642. For example, the conductive vias 660 may be arranged in a predetermined array between the first slit 641 and the second slit 642 and be formed to penetrate the third layer 600c.

According to an embodiment, the conductive vias 660 may be formed in the second layer 600b, the third layer 600c, and the fourth layer 600d. For example, the conductive vias 660 may be formed to selectively conduct between the second layer 600b including the third slit or the fourth layer 600d including the fourth slit 644.

According to an embodiment, the conductive vias 660 may be arranged in a row between the first-first line 641a and the second-first line 642a of the third layer 600c and be formed in the area where the first ground line 631 is disposed. As another example, the conductive vias 660 may be arranged in a row between the first-third line 641c and the second-third line 642c and be formed in the area where the first ground line 631 is disposed. As another example, the conductive vias 660 may be arranged in a row between the first-second line 641b and the second-second line 642b.

According to an embodiment, the plurality of conductive vias 660 may be manufactured using CNC hole processing and copper plating or using laser hole processing and copper plating.

According to various embodiments, the first layer 600a may form an upper surface of the printed circuit board 640 and be formed of a conductive layer to form a ground area of the printed circuit board 640. According to various embodiments, the second layer 600b may be disposed to face the first layer 600a in a size corresponding to the first layer 600a and may include at least one third slit 643. The third slit 643 may be shaped as an opening penetrating the second layer 600b and may be prepared in a size corresponding to the second slit 642 of the third layer, with the dielectric layer 700 disposed therebetween.

According to various embodiments, the third slit 643 formed in the second layer 600b, along with the second slit 642 formed in the third layer 600c, may form a double-slit structure along the stacked direction of the printed circuit board 640. The double-slit structure may reduce the electromagnetic waves generated as current flows through the power line 610.

According to various embodiments, the conductive vias 660 may be formed to selectively conduct between the third layer 600c and the second layer 600b including the third slit. For example, the conductive vias 660 arranged between the first-first line 641a and the second-first line 642a of the third layer 600c may conduct up to the second layer 600b which is positioned on an upper surface and be arranged along one side of the third-first line 643a. As another example, the conductive vias 660 arranged in a row between the first-third line 641c and the second-third line 642c may conduct up to the second layer 600b which is positioned on an upper surface and be arranged along one side of the third-third line 643c. As another example, the conductive vias 660 arranged in a row between the first-second line 641b and the second-second line 642b may conduct up to the second layer 600b which is positioned on an upper surface and be arranged along one side of the third-second line 643b.

According to various embodiments, the fourth layer 600d may be disposed to face the third layer 600c in a size corresponding to the third layer 600c and may include at least one fourth slit 644. The fourth slit 644 may be shaped as an opening penetrating the fourth layer 600d and may be prepared in a size corresponding to the second slit 642 of the third layer, with the dielectric layer 700 disposed therebetween.

According to various embodiments, the fourth slit 644 formed in the fourth layer 600d, along with the second slit 642 formed in the third layer 600c, may form a double-slit structure along the stacked direction of the printed circuit board 640. The double-slit structure may reduce the electromagnetic waves generated as current flows through the power line 610.

According to various embodiments, the conductive vias 660 may be formed to selectively conduct between the third layer 600c and the fourth layer 600d including the fourth slit. For example, the conductive vias 660 arranged between the first-first line 641a and the second-first line 642a of the third layer 600c may conduct up to the fourth layer 600d which is positioned on a lower surface and be arranged along one side of the fourth-first line 644a. As another example, the conductive vias 660 arranged in a row between the first-third line 641c and the second-third line 642c may conduct up to the fourth layer 600d which is positioned on a lower surface and be arranged along one side of the fourth-third line 644c. As another example, the conductive vias 660 arranged in a row between the first-second line 641b and the second-second line 642b may conduct up to the second layer 600b which is positioned on a lower surface and be arranged along one side of the fourth-second line 644b.

According to an embodiment, the conductive vias 660 may be formed to selectively conduct through the second layer 600b, the third layer 600c, and the fourth layer 600d as shown, or the conductive vias 660 may be formed to electrically connect to the first layer 600a, the second layer 600b, the third layer 600c, the fourth layer 600d, and the fifth layer 600e to collectively conduct all the layers.

According to various embodiments, the fifth layer 600e may form a lower surface of the printed circuit board 640 and be formed of a conductive layer to form a ground area of the printed circuit board 640.

Figure 11:
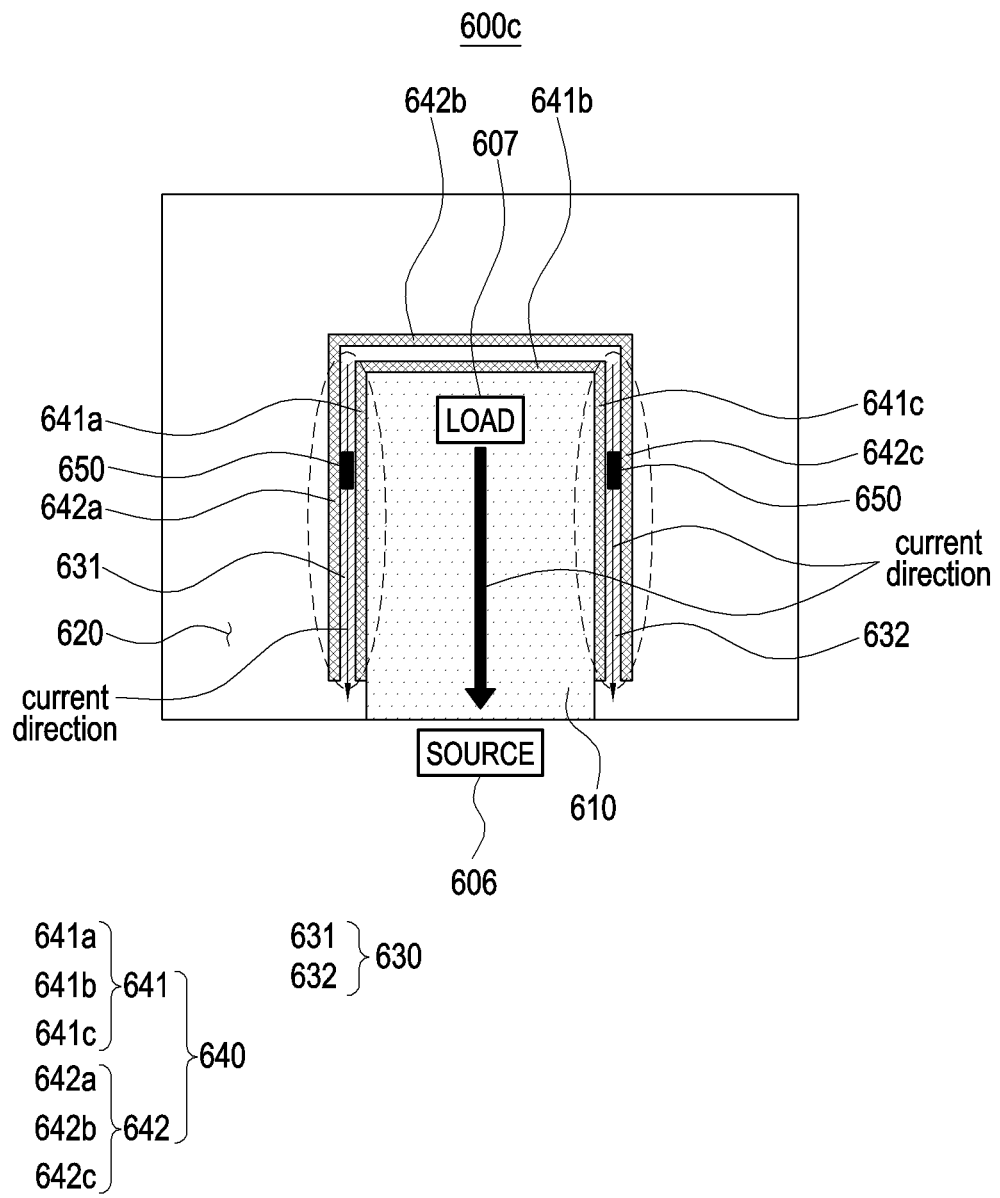
FIG. 11 is a plan view illustrating a structure of a conductive layer of a printed circuit board according to another embodiment of the disclosure.

FIG. 11 is a plan view illustrating a structure of a conductive layer of a printed circuit board according to another embodiment of the disclosure.

According to various embodiments, a printed circuit board (e.g., the printed circuit board 340 of FIG. 4) disposed in an electronic device (e.g., the electronic device 101 of FIGS. 1 to 4) may include a first substrate layer (e.g., the first layer 600a or second layer 600b of FIG. 8), a dielectric layer (e.g., the dielectric layer 700 of FIG. 8), and a second substrate layer 600c. The first substrate layer 600a or 600b, the dielectric layer 700, and the second substrate layer 600c may be stacked. The dielectric layer 700 may be provided between the first substrate layer 600a or 600b and the second substrate layer 600c to prevent the first substrate layer 600a or 600b and the second substrate layer 600c, which are formed of the conductive layers, from directly contacting each other.

Referring to FIG. 11, the second substrate layer 600c may include a power line 610, a ground unit 620, a ground line 630, a slit 640, and a plurality of conductive vias 660. The structure of the power line 610, ground unit 620, ground line 630, and slit 640 of the second substrate layer 600c of FIG. 6A may be applied to the structure of the power line 610, ground unit 620, ground line 630, and slit 640 of the second substrate layer 600c of FIG. 9. The configuration of the printed circuit board 640 of FIG. 9 is described below, focusing on what is different in configuration from the printed circuit board 640 of FIG. 6A.

According to various embodiments, the power line VBAT 710 may be electrically connected with a power source (e.g., the battery of FIG. 5) (source) 606 and extend to a portion of the second substrate layer 600c. The end of the power line 610, which extends to the portion of the second substrate layer 600c, may be connected to each load (e.g., electronic component) 607 mounted on the printed circuit board.

According to various embodiments, the ground unit 620 may be spaced apart along the power line 610.

According to various embodiments, the ground line 630 may extend from the ground unit 620 and be disposed in the spaced area. According to an embodiment, the ground line 630 may be formed to be spaced apart from the power line 610 by the slit 640, and a parasitic current generated by the ground line 630, corresponding to the current flowing through the power line 610, may generate an electromagnetic wave canceling off the electromagnetic wave formed from the power line 610.

According to various embodiments, at least one lumped element 650 may be disposed between the first slit 641 and the second slit 642. For example, the at least one lumped element 650 may be formed in an area of the ground line 630 between the first slit 641 and the second slit 642.

According to an embodiment, the lumped element 650 may be disposed in each of the areas corresponding to the first power line 610 and the second power line 610. For example, one lumped element 650 may be disposed between the first-first line 641a and the second-first line 642a or a plurality of lumped elements 650 may be arranged in a row between the first-first line 641a and the second-first line 642a. As another example, one lumped element 650 may be disposed between the first-third line 641c and the second-third line 642c or a plurality of lumped elements 650 may be arranged in a row between the first-third line 641c and the second-third line 642c. The lumped element 650 formed along the power line 610 may generate a parasitic electromagnetic wave reinforced with the ground line, canceling or attenuating the electromagnetic wave generated as current flows through the power line 610.

Figures 12A, 12B:
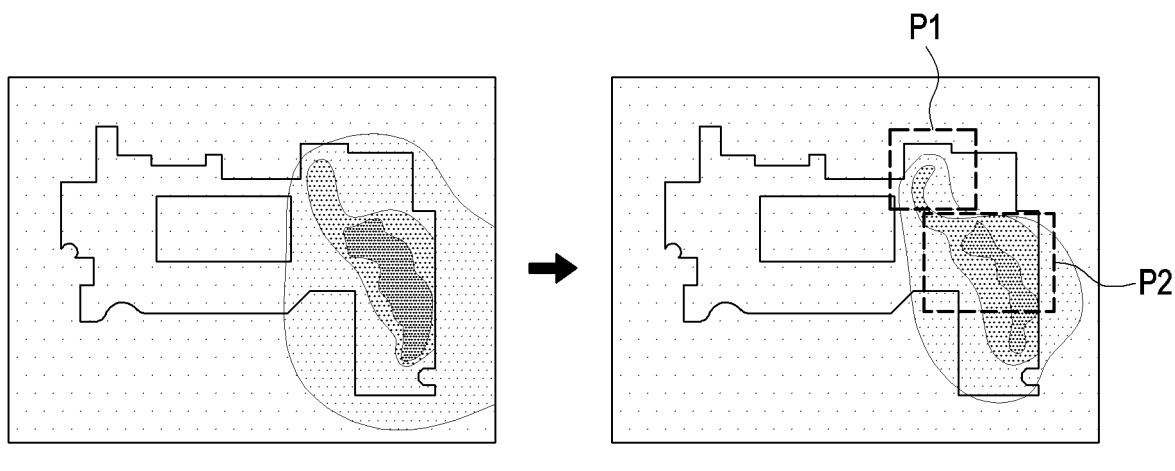
FIG. 12A is a view illustrating a magnetic field value after a slit is applied and FIG. 12B is a view illustrating a magnetic field value after a slit is applied.

FIGS. 12A and 12B are views illustrating an example of detecting a magnetic field to identify a reduction in the magnetic field generated around a power source of a printed circuit board. FIG. 12A is a view illustrating a magnetic field value after a slit is applied and FIG. 12B is a view illustrating a magnetic field value after a slit is applied.

The printed circuit board 640 of FIG. 12B may include a plurality of substrate layers, and at least one substrate layer may include a power line, a ground unit, a ground line, and a slit. The configuration of the second substrate layer 600c of FIG. 6A may be applied to the configuration of the printed circuit board 640 of FIG. 12B.

Referring to FIG. 12B, as compared with FIG. 12A, it may be identified that the magnetic field value is reduced in a section of the area where an electronic component is disposed, adjacent to the power line. The magnetic field value of FIG. 12A is about 150 A/m, and the magnetic field value of FIG. 12B is about 50 A/m or less. According to the disclosure, a double-slit structure is formed around the power line, generating an electromagnetic wave for canceling or attenuating the electromagnetic wave generated from the power line. Thus, it may be identified that the magnetic field value is reduced by about 100 A/m. Thus, it is possible to reduce damage to the electronic component mounted on the printed circuit board due to the magnetic field generated from the power line and hence to remove malfunction and/or noise of the electronic component.

Figures 13A, 13B, 13C:
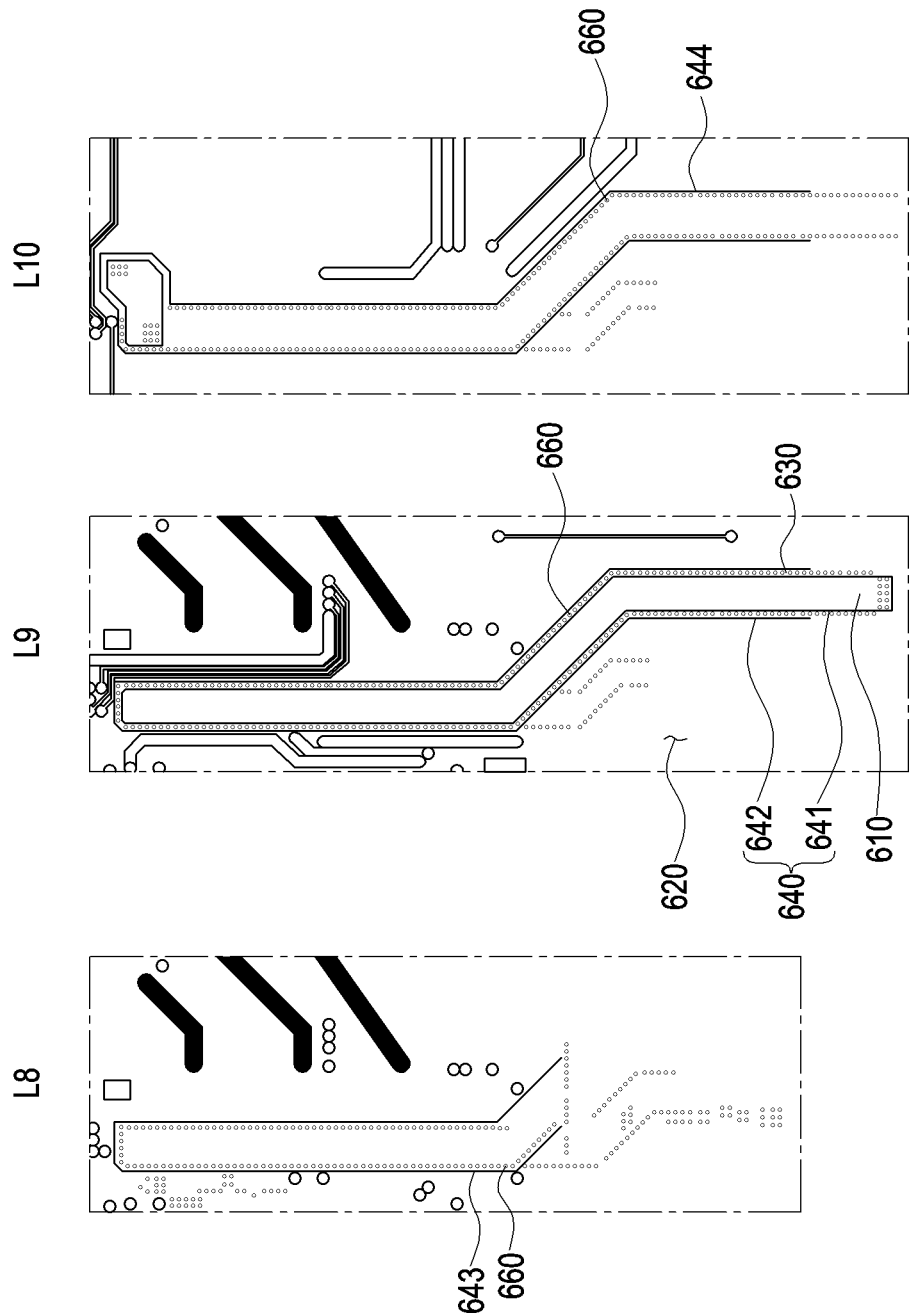
FIG. 13A is a view illustrating an eighth layer from the top among a plurality of substrate layers.
FIG. 13B is a view illustrating a ninth layer from the top among the plurality of substrate layers.
FIG. 13C is a view illustrating a tenth layer from the top among the plurality of substrate layers.

FIG. 13 is an enlarged view of some substrate layers in an area P1 of the printed circuit board 640 of FIG. 12B. FIG. 13A is a view illustrating an eighth layer L8 from the top among a plurality of substrate layers, FIG. 13B is a view illustrating a ninth layer L9 from the top among the plurality of substrate layers, and FIG. 13C is a view illustrating a tenth layer L10 from the top among the plurality of substrate layers.

The configuration of the second layer 600b, third layer 600c, and fourth layer 600d of FIGS. 8 and 10 may be applied to the configuration of the substrate layers L8, L9, and L10 of FIGS. 13A to 13C.

Referring to FIG. 13B, the ninth layer L9 may include a power line 610, a ground unit 620, a ground line 630, a double-slit structure 640, and a plurality of conductive vias 660. The double-slit structure 640 may include a first slit 641 and a second slit 642 spaced apart from the first slit 641 and formed in a shape corresponding to the first slit 641.

Referring to FIG. 13A, the eighth layer L8 may include conductive vias 660 penetrating from the ninth layer L9 and the third slit 643 disposed to correspond to the second slit 642. The second slit 642 and the third slit 643 may form a double-slit structure.

Referring to FIG. 13C, the tenth layer L10 may include conductive vias 660 penetrating from the ninth layer L9 and the fourth slit 644 disposed to correspond to the second slit 642. The second slit 642 and the fourth slit 644 may form a double-slit structure.

According to an embodiment, the electromagnetic wave generated by the power line 610 may be attenuated by the double-slit structure, reducing influence on the electronic component disposed on the P1 area.

Figures 14A, 14B, 14C:
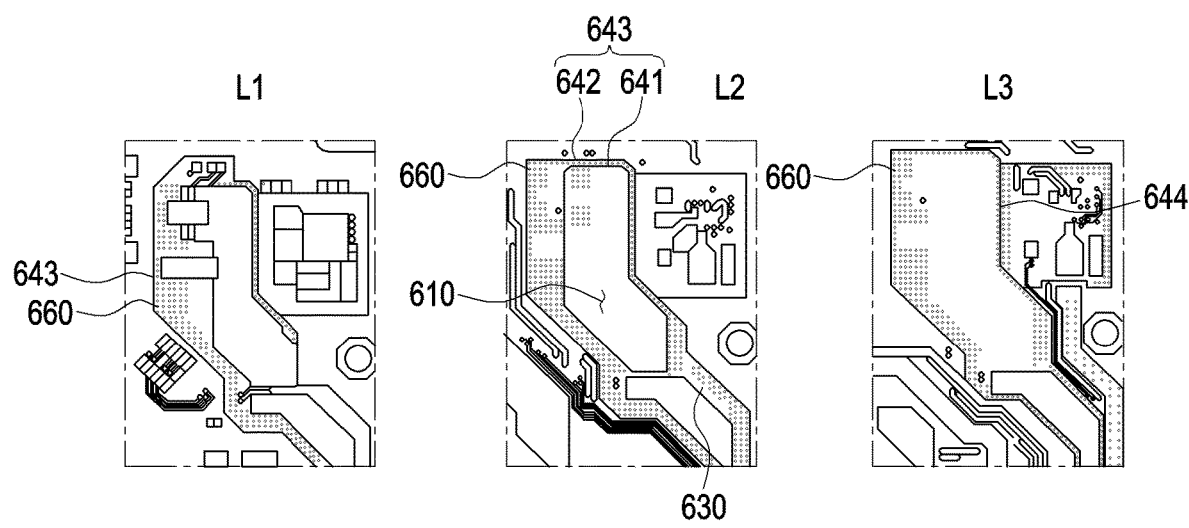
FIG. 14A is a view illustrating a first layer from the top among a plurality of substrate layers.
FIG. 14B is a view illustrating a second layer from the top among the plurality of substrate layers.
FIG. 14C is a view illustrating a third layer from the top among the plurality of substrate layers.

FIG. 14 is an enlarged view of some substrate layers in an area P2 of the printed circuit board 640 of FIG. 12B. FIG. 14A is a view illustrating a first layer L1 from the top among a plurality of substrate layers, FIG. 14B is a view illustrating a second layer L2 from the top among the plurality of substrate layers, and FIG. 14C is a view illustrating a third layer L3 from the top among the plurality of substrate layers.

The configuration of the second layer 600b, third layer 600c, and fourth layer 600d of FIGS. 8 and 10 may be applied to the configuration of the substrate layers L1, L2, and L3 of FIGS. 14A to 14C.

Referring to FIG. 14B, the second layer L2 may include a power line 610, a ground unit 620, a ground line 630, a double-slit structure 640, and a plurality of conductive vias 660. The double-slit structure 640 may include a first slit 641 and a second slit 642 spaced apart from the first slit 641 and formed in a shape corresponding to the first slit 641.

Referring to FIG. 14A, the first layer L1 may include conductive vias 660 penetrating from the second layer L2 and the third slit 643 disposed to correspond to the second slit 642. The second slit 642 and the third slit 643 may form a double-slit structure.

Referring to FIG. 14C, the third layer L3 may include conductive vias 660 penetrating from the second layer L2 and the fourth slit 644 disposed to correspond to the second slit 642. The second slit 642 and the fourth slit 644 may form a double-slit structure.

According to an embodiment, the electromagnetic wave generated by the power line 610 may be attenuated by the double-slit structure, reducing influence on the electronic component disposed on the P1 area.

Figure 15A:
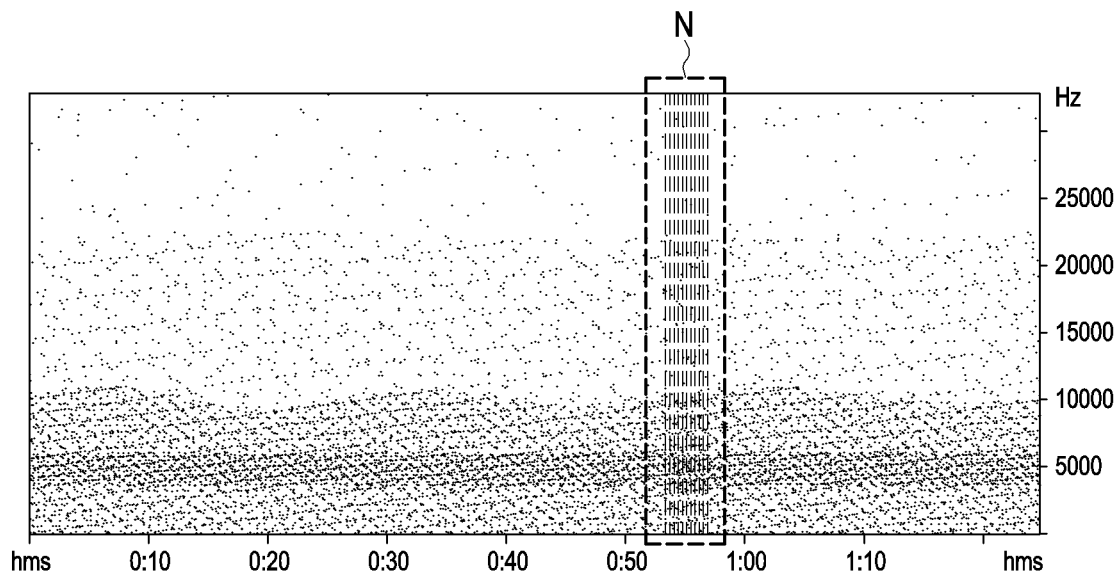
FIG. 15A is a graph illustrating an area of sizzling noise N when a slit is applied.
Figure 15B:
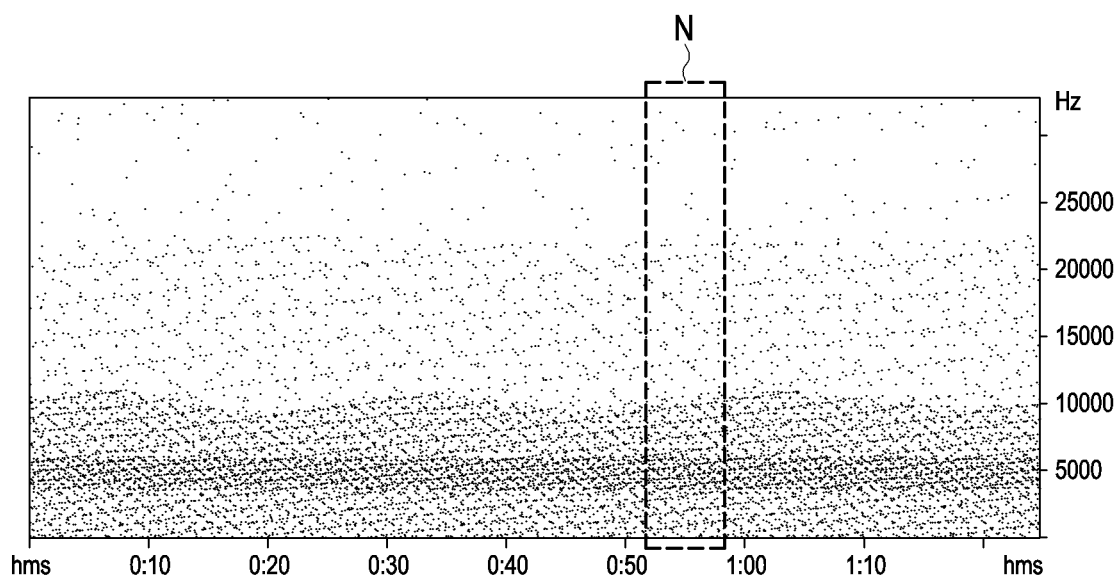
FIG. 15B is a graph illustrating an area in which the sizzling noise N has been mitigated after the slit is applied.

FIGS. 15A and 15B are graphs illustrating an example of identifying a reduction in the sizzling noise generated around a power line of a printed circuit board. FIG. 15A is a graph illustrating an area of sizzling noise N when a slit is applied, and FIG. 15B is a graph illustrating an area in which the sizzling noise N has been mitigated after the slit is applied.

The printed circuit board 640 of FIG. 15B may include a plurality of substrate layers, and at least one substrate layer may include a power line, a ground unit, a ground line, and a slit. The configuration of the second substrate layer 600c of FIG. 6A may be applied to the configuration of the printed circuit board 640 of FIG. 15B.

Among the electronic components mounted in the electronic device, the receiver RCV and/or speaker SPK module includes a coil. The coil may be influenced by the strong magnetic field generated from, e.g., the power line, causing a malfunction. Such malfunction may be interference with sound, such as sizzling noise and cause inconvenience to the user of the electronic device.

Referring to FIG. 15B, as compared with FIG. 15A, it may be identified that the area of the sizzling noise has been gone in a section of the area where an electronic component is disposed, adjacent to the power line. According to an embodiment of the disclosure, the electromagnetic wave generated due to the power line may be attenuated by the double-slit structure, mitigating the sizzling noise in the receiver RCV and/or speaker SPK module.

According to various embodiments of the disclosure, a printed circuit board (e.g., the printed circuit board 640 of FIG. 6A) may include a first substrate layer (e.g., the first layer 600a or second layer 600b of FIG. 8), a dielectric layer (e.g., the dielectric layer 700 of FIG. 7) stacked under the first substrate layer, and a second substrate layer (e.g., the second substrate layer 600c of FIG. 6A or the third layer 600c of FIG. 8) stacked under the dielectric layer. The second substrate layer may include a power line (e.g., the power line 610 of FIG. 6A), a ground unit (e.g., the ground unit 620 of FIG. 6A) disposed with an area spaced apart along the power line, and a ground line (e.g., the ground line 630 of FIG. 6A) extending from the ground unit and disposed in the spaced area, the ground line separating the spaced area into a first section (e.g., the first section S1 of FIG. 6A) and a second section (e.g., the second section S2 of FIG. 6A) to generate an electromagnetic wave cancelling off an electromagnetic wave generated from a current flowing through the power line.

According to various embodiments, the first section may form a first slit (e.g., the first slit 641 of FIG. 6A), and the second section may form a second slit (e.g., the second slit 642 of FIG. 6A) having a shape corresponding to the first slit. The first slit and the second slit may penetrate the second substrate layer.

According to various embodiments, the first slit may be formed to surround at least part of the power line, and the second slit may be spaced apart from the first slit in a direction different from the power line and may be formed along at least part of the first slit.

According to various embodiments, the first slit may include a first-first line (e.g., the first-first line 641a of FIG. 6A), a first-second line (e.g., the first-second line 641b of FIG. 6A) extending from the first-first line and facing in a direction different from the first-first line, and a first-third line (e.g., the first-third line 641c of FIG. 6A) extending from the first-second line and facing in the same direction as the first-first line.

According to various embodiments, the second slit may be spaced apart along an edge of the power line and include a second-first line (e.g., the second-first line 642a of FIG. 6A) corresponding to the first-first line, a second-second line (e.g., the second-second line 642b of FIG. 6A) extending from the second-first line and facing in a direction different from the second-first line, and a second-third line (e.g., the second-third line 642c of FIG. 6A) extending from the second-second line and facing in the same direction as the second-first line.

According to various embodiments, the ground line may be spaced apart from, and disposed in parallel with, the power line, and the ground line may generate a parasitic current in the same direction as a current generated from the power line.

According to various embodiments, the ground line may include a first ground line (e.g., the first ground line 631 of FIG. 6A) spaced apart from a side of the power line and formed between the first-first line of the first slit and the second-first line of the second slit and a second ground line (e.g., the second ground line 632 of FIG. 6A) spaced apart from another side of the power line and formed between the first-third line of the first slit and the second-third line of the second slit.

According to various embodiments, the printed circuit board may further include at least one lumped element (e.g., the lumped element 650 of FIG. 11) disposed on the ground line.

According to various embodiments, a parasitic electromagnetic wave canceling off an electromagnetic wave generated around the power line may be generated from the first slit and an area adjacent thereto. A parasitic electromagnetic wave canceling off the electromagnetic wave generated around the power line may be generated from the second slit and an area adjacent thereto.

According to various embodiments, the plurality of conductive vias may be arranged between the first slit and the second slit.

According to various embodiments, the printed circuit board may further include a second dielectric layer disposed under the second substrate layer and a third substrate layer stacked under the second dielectric layer. The first substrate layer or the third substrate layer may have a slit having a shape corresponding to the second slit.

According to various embodiments, the second substrate layer may further include a plurality of conductive vias formed corresponding to the ground line.

According to various embodiments, the second slit may be larger in area than the first slit.

According to various embodiments of the disclosure, a printed circuit board 640 may include a first conductive layer (e.g., the first layer 600a of FIG. 7) exposed in a first direction (e.g., the first direction +Z of FIG. 7), a second conductive layer (e.g., the second layer 600b of FIG. 7) disposed in a second direction (e.g., the second direction −Z of FIG. 7) opposite to the first direction, a third conductive layer (e.g., the third layer 600c of FIG. 7) disposed in the second direction of the second conductive layer, a fourth conductive layer (e.g., the fourth layer 600d of FIG. 7) disposed in the second direction of the third conductive layer, and a fifth conductive layer (e.g., the fifth layer 600e of FIG. 7) disposed in the second direction of the fourth conductive layer. The third substrate layer may include a power line (e.g., the power line 610 of FIG. 8), a ground unit (e.g., the ground unit 620 of FIG. 8) disposed with an area spaced apart along the power line, and a ground line (e.g., the ground line 630 of FIG. 8) extending from the ground unit and disposed in the spaced area, the ground line separating the spaced area into a first area and a second area to generate an electromagnetic wave cancelling off an electromagnetic wave generated from a current flowing through the power line.

According to various embodiments, the first section may form a first slit, and the second section may form a second slit having a shape corresponding to the first slit. The first slit and the second slit may penetrate the second substrate layer.

According to various embodiments, the first slit may be formed to surround at least part of the power line, and the second slit may be spaced apart from the first slit in a direction different from the power line and may be formed along at least part of the first slit.

According to various embodiments, the first conductive layer may form a ground area, and the second conductive layer may form a third slit having a shape corresponding to the second slit of the third conductive layer, with a dielectric layer disposed therebetween.

According to various embodiments, the fourth conductive layer may form a fourth slit having a shape corresponding to the second slit of the third conductive layer, with a dielectric layer disposed therebetween, and the fifth conductive layer may form a ground area.

According to various embodiments of the disclosure, an electronic device (e.g., the electronic device 101 of FIGS. 1 to 4) may comprise a housing (e.g., the housing 310 of FIGS. 2 and 3), a printed circuit board 640 including a plurality of conductive layers (e.g., the plurality of conductive layers 600a, 600b, 600c, 600d, and 600e of FIG. 7) and at least one dielectric layer 700 alternately stacked one above another, an electronic component mounted on the printed circuit board, and a battery 350 disposed adjacent to the printed circuit board. At least one conductive layer of the printed circuit board may include a power line including a first end disposed adjacent to the electronic component, a ground unit disposed with an area spaced apart along the power line, a ground line extending from the ground unit and disposed in the spaced area, the ground line separating the spaced area into a first section and a second section to generate an electromagnetic wave cancelling off an electromagnetic wave generated from a current flowing through the power line, and a double-slit structure formed in the first section and the second section.

According to various embodiments, the double-slit structure may include a first slit formed to surround at least part of the power line and a second slit spaced apart from the first slit and formed along at least part of the first slit.

According to various embodiments, the at least one conductive layer may further include a plurality of conductive vias arranged in parallel with the first slit and the second slit along the ground line.

It is apparent to one of ordinary skill in the art that the camera modules according to various embodiments of the disclosure as described above are not limited to the above-described embodiments and those shown in the drawings, and various changes, modifications, or alterations may be made thereto without departing from the scope of the disclosure.

The invention claimed is:

1. A printed circuit board (PCB) comprising:
a first substrate layer;
a dielectric layer disposed under the first substrate layer; and
a second substrate layer composed of a conductive material and disposed under the dielectric layer, the second substrate layer including:
a first slit formed as surrounding a first area of the second substrate layer such that the first area surrounded by the first slit is to operate as a power line area to which a power load is to be electrically connected; and
a second slit formed as surrounding a first portion of the first slit and not a second portion of the first slit such that a second area of the second substrate layer between the second slit and the first portion of the first slit is to operate as a ground line, and that a third area of the second substrate layer outwardly adjacent to the second portion of the first slit is to operate as a ground area.

2. The PCB of claim 1, wherein at least a portion of the second area forms a linear shaped area substantially parallel to the first area.

3. The PCB of claim 2, further comprising:
a plurality of vias formed in the second area, at least one via of the plurality of vias formed through the dielectric layer such that the second substrate layer is to be electrically connected with the first substrate layer via the at least one via.

4. The PCB of claim 1, wherein the first substrate layer includes a third slit substantially corresponding to the second slit such that a portion of the second slit is overlapped with at least a portion of the third slit when viewed from a direction substantially perpendicular to the second substrate layer.

5. The PCB of claim 4, further comprising:
another dielectric layer disposed under the second substrate layer; and
a third substrate layer disposed under the another dielectric layer, the third substrate layer including a fourth slit substantially corresponding to the second slit such that the portion of the second slit is overlapped with at least a portion of the fourth slit when viewed from the direction.

6. The PCB of claim 1, further comprising:
a lumped element disposed in the second area.

7. The PCB of claim 1, wherein, when a current is applied to the first area operating as the power line area, a parasitic current is generated in the second area such that an electromagnetic wave caused by the current is at least partially reduced by an electromagnetic wave caused by the parasitic current.

8. The PCB of claim 1, wherein the first portion of the first slit includes:
a first-first line;
a first-second line extending from the first-first line and facing in a direction different from the first-first line; and
a first-third line facing in the same direction as the first-first line.

9. The PCB of claim 8, wherein the second slit includes:
a second-first line corresponding to the first-first line;
a second-second line extending from the second-first line and facing in a direction different from the second-first line; and
a second-third line facing in the same direction as the second-first line.

10. An electronic device, comprising:
a housing;
a printed circuit board (PCB) including a plurality of conductive layers and at least one dielectric layer alternately stacked one above another;
an electronic component mounted on the PCB; and
a battery disposed adjacent to the PCB, the PCB comprising:
a first substrate layer;
a dielectric layer disposed under the first substrate layer; and
a second substrate layer composed of a conductive material and disposed under the dielectric layer, the second substrate layer including:
a first slit formed as surrounding a first area of the second substrate layer such that the first area surrounded by the first slit is to operate as a power line area to which a power load is to be electrically connected; and
a second slit formed as surrounding a first portion of the first slit and not a second portion of the first slit such that a second area of the second substrate layer between the second slit and the first portion of the first slit is to operate as a ground line, and that a third area of the second substrate layer outwardly adjacent to the second portion of the first slit is to operate as a ground area.

11. The electronic device of claim 10, wherein at least a portion of the second area forms a linear shaped area substantially parallel to the first area.

12. The electronic device of claim 11, the PCB further comprising:
a plurality of vias formed in the second area, at least one via of the plurality of vias formed through the dielectric layer such that the second substrate layer is to be electrically connected with the first substrate layer via the at least one via.

13. The electronic device of claim 10, wherein the first substrate layer includes a third slit substantially corresponding to the second slit such that a portion of the second slit is overlapped with at least a portion of the third slit when viewed from a direction substantially perpendicular to the second substrate layer.

14. The electronic device of claim 13, the PCB further comprising:

another dielectric layer disposed under the second substrate layer; and a third substrate layer disposed under the another dielectric layer, the third substrate layer including a fourth slit substantially corresponding to the second slit such that the portion of the second slit is overlapped with at least a portion of the fourth slit when viewed from the direction.

15. The electronic device of claim 10, the PCB further comprising:

a lumped element disposed in the second area.

* * * * *